(12) United States Patent
Aoki

(10) Patent No.: US 10,564,548 B2
(45) Date of Patent: Feb. 18, 2020

(54) EXPOSURE APPARATUS, MANUFACTURING METHOD OF FLAT-PANEL DISPLAY, DEVICE MANUFACTURING METHOD, AND EXPOSURE METHOD

(71) Applicant: NIKON CORPORATION, Tokyo (JP)

(72) Inventor: Yasuo Aoki, Zushi (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 15/711,377

(22) Filed: Sep. 21, 2017

(65) Prior Publication Data

US 2018/0067397 A1    Mar. 8, 2018

Related U.S. Application Data

(63) Continuation of application No. PCT/JP2016/060551, filed on Mar. 30, 2016.

(30) Foreign Application Priority Data

Mar. 31, 2015   (JP) .................................. 2015-070595

(51) Int. Cl.
*G03F 7/20*        (2006.01)
*H01L 21/683*      (2006.01)

(52) U.S. Cl.
CPC ............ *G03F 7/2037* (2013.01); *G03F 7/201* (2013.01); *G03F 7/70775* (2013.01); *H01L 21/6838* (2013.01)

(58) Field of Classification Search
CPC .. G03F 7/707; G03F 7/70716; G03F 7/70691; G03F 7/70725; G03F 7/70733
See application file for complete search history.

(56) References Cited

U.S. PATENT DOCUMENTS 5,729,331 A    3/1998  Tanaka et al.
6,552,775 B1   4/2003  Yanagihara et al.
(Continued)

FOREIGN PATENT DOCUMENTS

JP    2011-044713 A    3/2011

OTHER PUBLICATIONS

Jun. 14, 2016 International Search Report issued in International Patent Application No. PCT/JP2016/060551.
(Continued)

*Primary Examiner* — Steven Whitesell Gordon
(74) *Attorney, Agent, or Firm* — Oliff PLC

(57) ABSTRACT

An exposure apparatus that scans and exposes each of a plurality of areas on a glass substrate, by irradiating the substrate with an illumination light via a projection optical system and relatively driving the substrate with respect to the illumination light, is equipped with: a substrate holder that levitates and supports a first area of the substrate; a substrate carrier that holds the glass substrate levitated and supported by the substrate holder; an X coarse movement stage that drives the substrate holder; an X voice coil motor that drives the substrate carrier; and a controller that controls the X coarse movement stage and the X voice coil motor so that the substrate holder and the substrate carrier are driven, respectively, in scanning exposure. Accordingly, an exposure apparatus with improved position controllability of an object can be provided.

36 Claims, 17 Drawing Sheets

(56) References Cited

U.S. PATENT DOCUMENTS

| | | | |
|---|---|---|---|
| 2007/0017442 A1* | 1/2007 | Yamasaki | H01L 21/6715 |
| | | | 118/695 |
| 2008/0229811 A1* | 9/2008 | Zhao | B25B 11/005 |
| | | | 73/104 |
| 2010/0018950 A1 | 1/2010 | Aoki et al. | |
| 2011/0042874 A1 | 2/2011 | Aoki et al. | |
| 2011/0053092 A1* | 3/2011 | Aoki | B65G 49/065 |
| | | | 430/319 |
| 2012/0056105 A1* | 3/2012 | Aoki | G03F 7/70716 |
| | | | 250/491.1 |
| 2012/0064460 A1* | 3/2012 | Aoki | G03F 7/709 |
| | | | 430/320 |

OTHER PUBLICATIONS

Jun. 14, 2016 Written Opinion issued in International Patent Application No. PCT/JP2016/060551.

\* cited by examiner

EXPOSURE APPARATUS, MANUFACTURING METHOD OF FLAT-PANEL DISPLAY, DEVICE MANUFACTURING METHOD, AND EXPOSURE METHOD

CROSS-REFERENCE TO RELATED APPLICATIONS

This application is a continuation of International Application PCT/JP2016/060551, with an international filing date of Mar. 30, 2016, the disclosure of which is hereby incorporated herein by reference in its entirety, which was not published in English.

BACKGROUND OF THE INVENTION

Field of the Invention

The present invention relates to exposure apparatuses, manufacturing methods of flat-panel displays, device manufacturing methods and exposure methods, and more particularly to an exposure apparatus and an exposure method to drive an object relative to an illumination light, thereby scanning and exposing the object, a manufacturing method of flat-panel displays using the exposure apparatus or the exposure method, and a device manufacturing method.

Description of the Background Art

Conventionally, in a lithography process for manufacturing electronic devices (microdevices) such as liquid crystal display devices and semiconductor devices (integrated circuits and the like), exposure apparatuses such as an exposure apparatus of a step-and-scan method (a so-called scanning stepper (which is also called a scanner)) that, while synchronously moving a mask or a reticle (hereinafter, generically referred to as a "mask") and a glass plate or a wafer (hereinafter, generically referred to as a "substrate") along a predetermined scanning direction, transfers a pattern formed on the mask onto the substrate using an energy beam, are used.

As this type of exposure apparatuses, the exposure apparatus is known, in which a substrate holder that holds a substrate is finely driven in directions of three degrees of freedom within a horizontal plane (a scan direction, a cross-scan direction, and a rotational direction within the horizontal plane), in order to position the substrate within the horizontal pane with high speed and high accuracy.

The positioning control of the substrate has tended to be difficult because the substrate holder increases in size due to the increase in size of the substrate in recent years.

SUMMARY OF INVENTION

The present invention has been made under the circumstance described above, and according to a first aspect, there is provided a first exposure apparatus that scans and exposes each of a plurality of areas on an object by irradiating the object with an illumination light via an optical system and relatively moving the object with respect to the illumination light, the apparatus comprising: a support section that levitates and supports at least a first area of the plurality of areas; a holding section that holds the object levitated and supported by the support section; a first drive system that drives the support section; a second drive system that drives the holding section; and a control system that controls the first and the second drive systems to move the support section and the holding section, respectively, in scanning exposure with respect to the first area.

According to a second aspect of the present invention, there is provided a second exposure apparatus that scans and exposes each of a plurality of areas on an object by irradiating the object with an illumination light and relatively moving the object with respect to the illumination light in a first direction, the apparatus comprising: a support section that levitates and supports at least a first area of the plurality of areas; a holding section that holds the object levitated and supported by the support section; a first drive system that moves the support section in one direction of the first direction and a second direction intersecting the first direction; and a second drive system that relatively moves the holding section with respect to the support section in an other direction of the first and the second directions so that the first area moves off from the support section.

According to a third aspect of the present invention, there is provided a manufacturing method of a flat-panel display, comprising: exposing the object using the first or the second exposure apparatus of the present invention; and developing the object that has been exposed.

According to a fourth aspect of the present invention, there is provided a device manufacturing method, comprising: exposing the object using the first or the second exposure apparatus of the present invention; and developing the object that has been exposed.

According to a fifth aspect of the present invention, there is provided a first exposure method of scanning and exposing each of a plurality of areas on an object by irradiating the object with an illumination light via an optical system and relatively moving the object with respect to the illumination light, the method comprising: levitating and supporting at least a first area of the plurality of areas, using a support section; holding the object levitated and supported by the support section, using a holding section; and controlling a first drive system that drives the support section and a second drive system that drives the holding section so that support section and the holding section are moved, respectively, in scanning exposure with respect to the first area.

According to a sixth aspect of the present invention, there is provided a second exposure method of scanning and exposing each of a plurality of areas on an object by irradiating the object with an illumination light and relatively moving the object with respect to the illumination light in a first direction, the method comprising: levitating and supporting at least a first area of the plurality of areas, using a support section; holding the object levitated and supported by the support section, using a holding section; moving the support section in one direction of the first direction and a second direction intersecting the first direction, using a first drive system; and relatively moving the holding section with respect to the support section in an other direction of the first and the second directions so that the first area moves off from the support section, using a second drive system.

According to a seventh aspect of the present invention, there is provided a manufacturing method of a flat-panel display, comprising: exposing the object using the first or the second exposure method of the present invention; and developing the object that has been exposed.

According to an eighth aspect of the present invention, there is provided a device manufacturing method, comprising: exposing the object using the first or the second exposure method of the present invention; and developing the object that has been exposed.

BRIEF DESCRIPTION OF DRAWINGS

In the accompanying drawings.

DESCRIPTION OF EMBODIMENTS

First Embodiment

A first embodiment will be described below on the basis of FIGS. 1 to 4.

Figure 1:
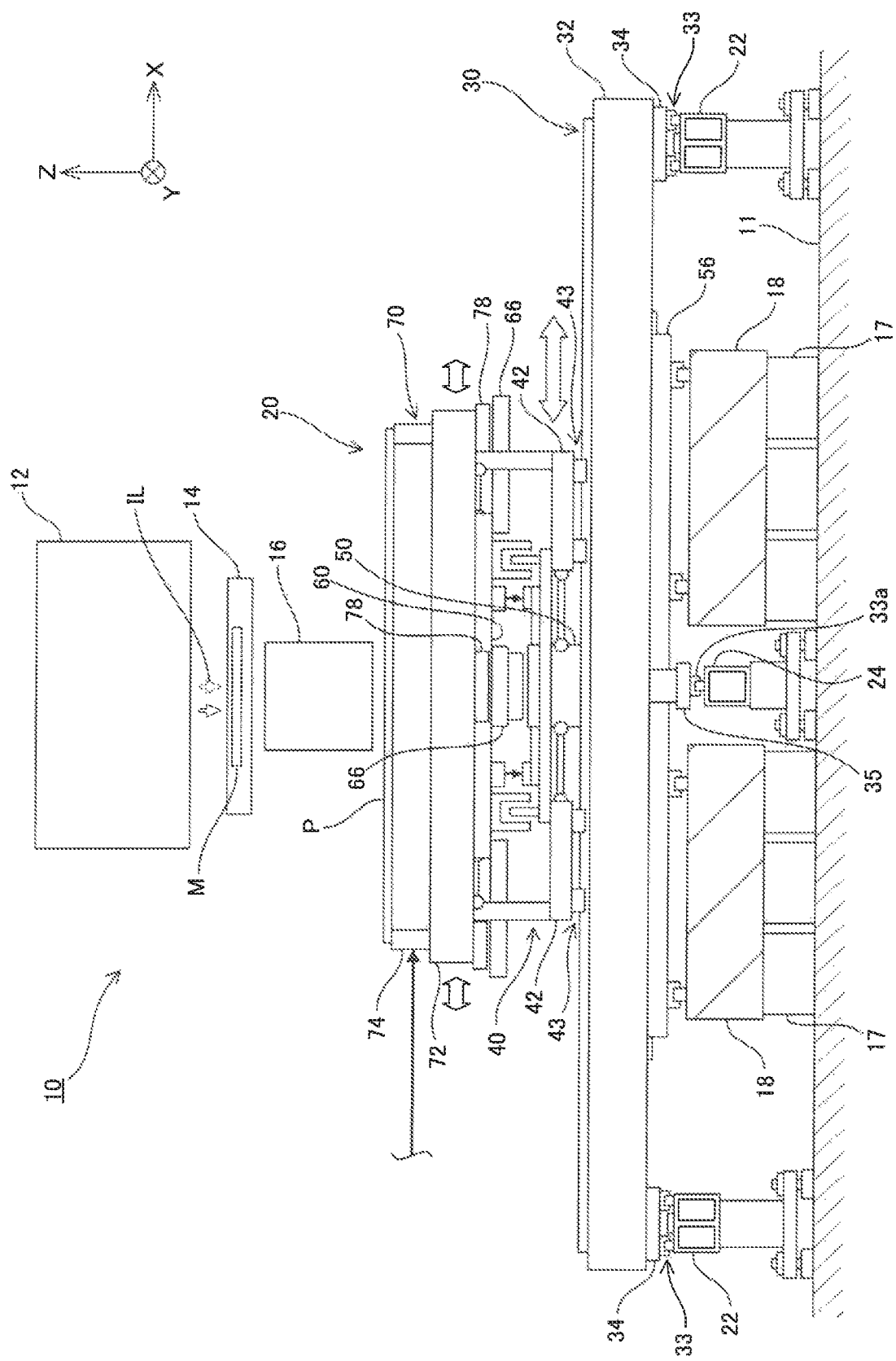
FIG. 1 is a view schematically showing a configuration of a liquid crystal exposure apparatus related to a first embodiment.

FIG. 1 schematically shows a configuration of a liquid crystal exposure apparatus 10 related to the first embodiment. Liquid crystal exposure apparatus 10 is a projection exposure apparatus of a step-and-scan method with a rectangular (square) glass substrate P (hereinafter, simply referred to as a substrate P) that is used in, for example, a liquid crystal display device (a flat-panel display) or the like, serving as an exposure target, which is a so-called scanner.

Liquid crystal exposure apparatus 10 has: an illumination system 12; a mask stage 14 to hold a mask M on which patterns such as a circuit pattern are formed; a projection optical system 16; a pair of stage stands 18; a substrate stage device 20 to hold substrate P whose surface (a surface facing the +Z side in FIG. 1) is coated with resist (sensitive agent); a control system thereof; and the like. Hereinafter, the explanation is given assuming that a direction in which mask M and substrate P are each scanned relative to projection optical system 16 on exposure is an X-axis direction, a direction orthogonal to the X-axis within a horizontal plane is a Y-axis direction, and a direction orthogonal to the X-axis and the Y-axis is a Z-axis direction, and assuming that rotation (tilt) directions around the X-axis, the Y-axis and the Z-axis are a θx direction, a θy direction and a θz direction, respectively. Further, the explanation is given assuming that the positions in the X-axis direction, the Y-axis direction and the Z-axis direction are an X-position, a Y-position and a Z-position, respectively.

Illumination system 12 is configured similar to an illumination system disclosed in, for example, U.S. Pat. No. 5,729,331 and the like. Illumination system 12 irradiates mask M with light emitted from a light source (not illustrated) (e.g. a mercury lamp), as illumination light for exposure (illumination light) IL, via a reflection mirror, a dichroic mirror, a shutter, a wavelength selecting filter, various types of lenses and the like (none of which are illustrated). As illumination light IL, for example, light such as an i-line (with wavelength of 365 nm), a g-line (with wavelength of 436 nm), and an h-line (with wavelength of 405 nm) (or synthetic light of the i-line, the g-line and the h-line described above) is used.

Mask stage 14 holds a light-transmissive mask M. Mask stage 14 drives mask M with respect to illumination system 12 (illumination light IL) with a predetermined long stroke at least in the X-axis direction (a scan direction), and finely drives mask M in the Y-axis direction and the θz direction, via a drive system (not illustrated) including, for example, a linear motor. Positional information of mask M within the horizontal plane is obtained with a mask stage position measurement system (not illustrated) including, for example, a laser interferometer.

Projection optical system 16 is disposed below mask stage 14. Projection optical system 16 is a so-called multi-lens type projection optical system having a configuration similar to a projection optical system disclosed in, for example, U.S. Pat. No. 6,552,775 and the like, and projection optical system 16 is equipped with, for example, a plurality of both-side telecentric optical systems that form erected normal images.

In liquid crystal exposure apparatus 10, when mask M located within a predetermined illumination area is illuminated with illumination light IL from illumination system 12, by the illumination light that has passed through mask M, a projection image of a pattern (a partial pattern image) of mask M within the illumination area is formed on an exposure area on substrate P, via projection optical system 16. Then, mask M is moved in the scanning direction relative to the illumination area (illumination light IL) and also substrate P is moved in the scanning direction relative to the exposure area (illumination light IL), and thereby the scanning exposure of one shot area on substrate P is performed and the pattern formed on mask M (the pattern as a whole corresponding to a scanning range of mask M) is transferred onto the shot area. Here, the illumination area on mask M and the exposure area (an irradiation area of the illumination light) on substrate P are in a relationship optically conjugate with each other by projection optical system 16.

Figure 4:
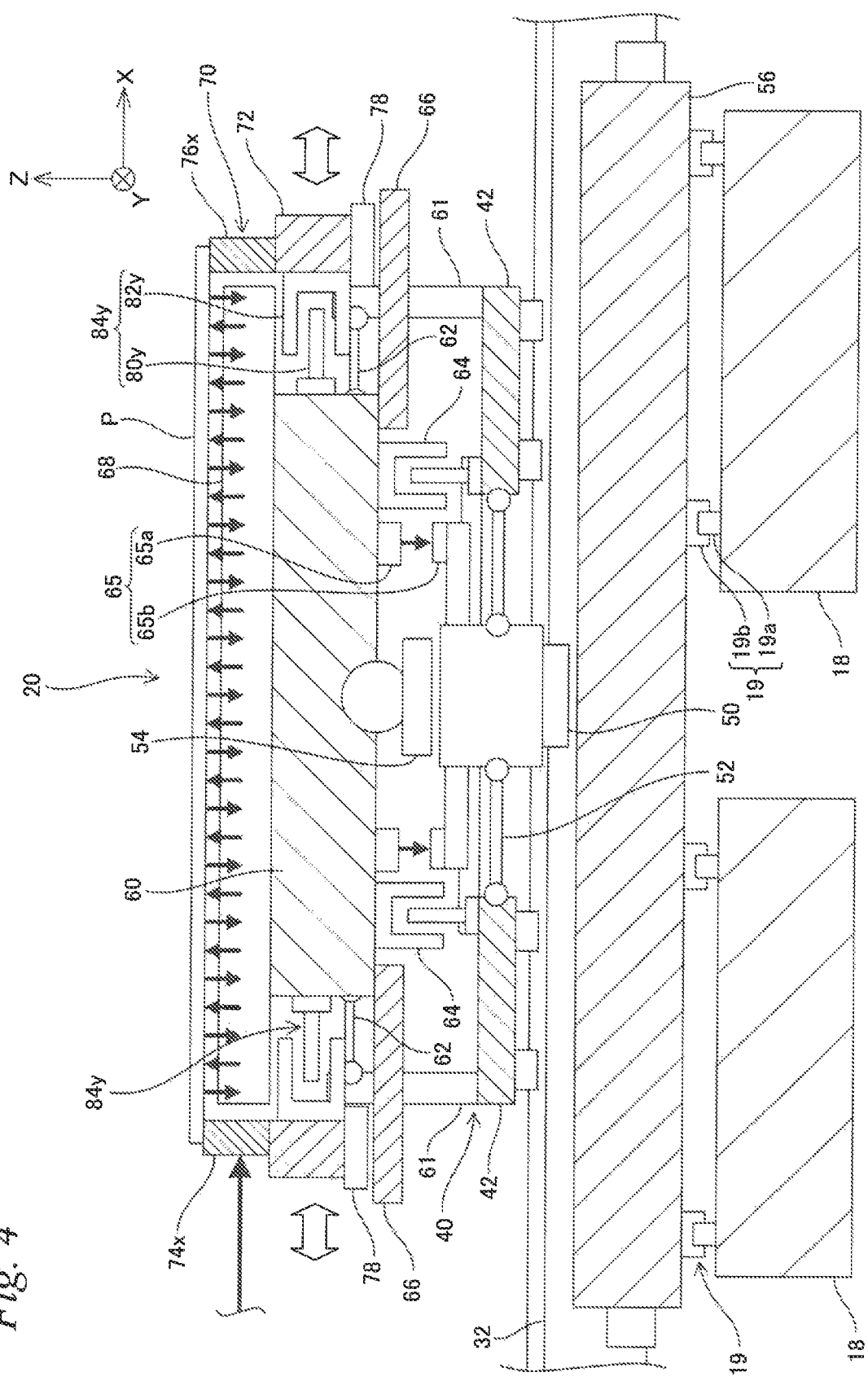
FIG. 4 is a partial enlarged view of a cross section taken along the line A-A in FIG. 2.

The pair of stage stands 18 are each made up of a member extending in the Y-axis direction, and are disposed spaced apart in the X-axis direction. Stage stands 18 are installed on a floor 11 of a clean room via a plurality of vibration isolation devices 17. On the upper surface of stage stand 18, as illustrated in FIG. 4, for example, two Y linear guides 19a extending in the Y-axis direction are fixed at a predetermined spacing in the X-axis direction.

Referring back to FIG. 1, substrate stage device 20 has a pair of base frames 22, an auxiliary guide frame 24, a Y coarse movement stage 30, an X coarse movement stage 40, a weight cancel device 50, a Y step guide 56, a substrate table 60, a substrate holder 68 (not illustrated in FIG. 1, see FIG. 4), and a substrate carrier 70.

Base frames 22 and auxiliary guide frame 24 are made up of members extending in the Y-axis direction. One of base frames 22 is disposed on the +X side of stage stand 18 on the +X side, the other of base frames 22 is disposed on the −X side of stage stand 18 on the −X side, and auxiliary guide frame 24 is disposed between the pair of stage stands 18 in a state of being vibrationally separating from the pair of stage stands 18.

Figure 2:
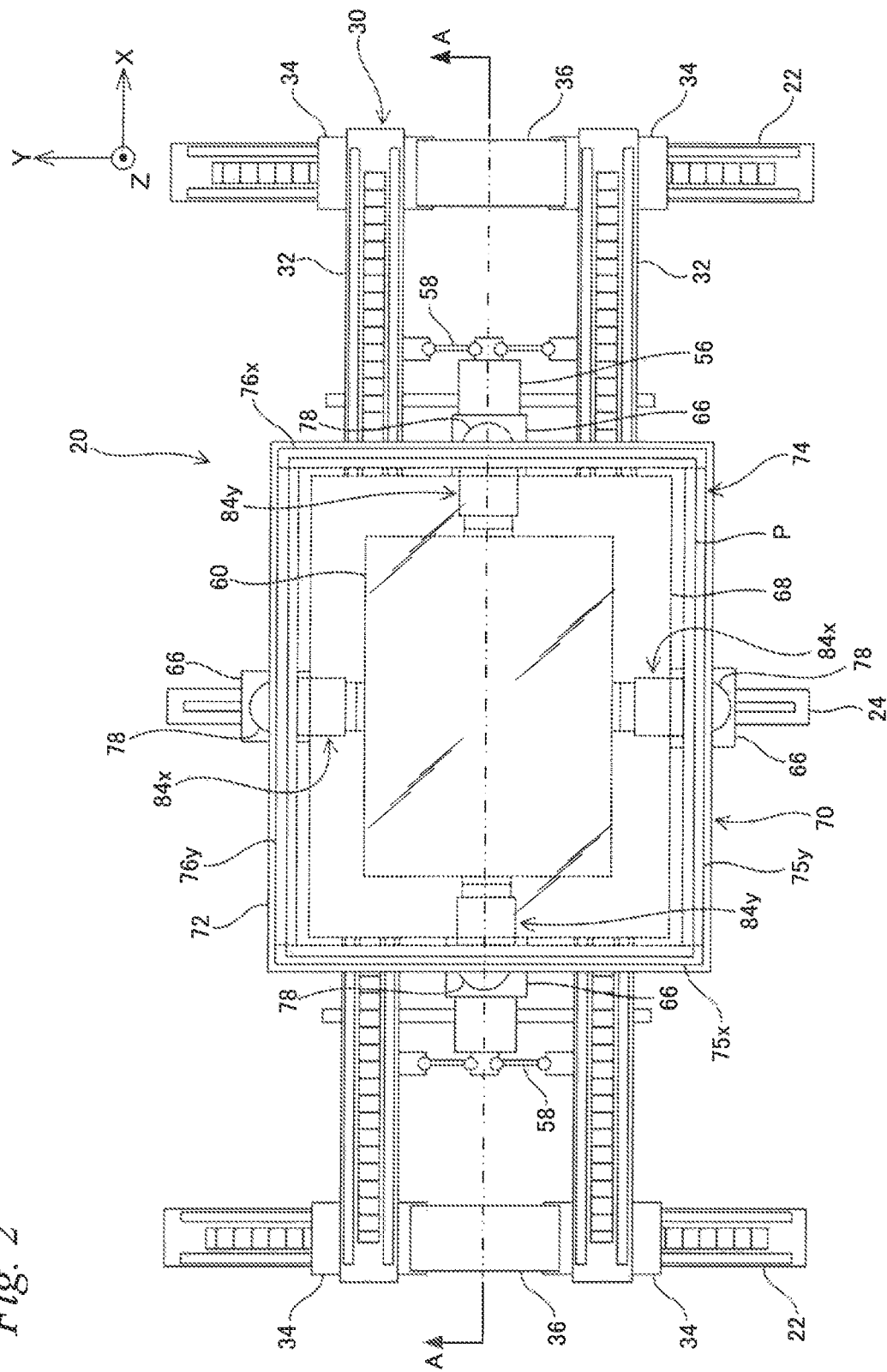
FIG. 2 is a plan view of a substrate stage device that is equipped in the liquid crystal exposure apparatus in FIG. 1.

Above each of the pair of base frames 22, as illustrated in FIG. 2, a pair of Y carriages 34 are placed spaced apart in the Y-axis direction. Y carriage 34 is a plate-like member having a rectangular shape in planar view. The pair of Y carriages 34 above base frame 22 on the +X side and the pair of Y carriages 34 above base frame 22 on the −X side are each coupled by a coupling plate 36. Referring back to FIG. 1, between Y carriages 34 and base frame 22 corresponding thereto, a Y drive system 33 is provided that includes a Y linear guide device for straightly guiding Y carriages 34 in the Y-axis direction, a Y actuator (e.g. a linear motor) for driving Y carriages 34 with a predetermined stroke in the Y-axis direction and a Y linear encoder used to obtain Y-position information of Y carriages 34 (a part of the elements is not illustrated). On auxiliary guide frame 24, an auxiliary carriage 35 is placed. Auxiliary carriage 35 is made up of a plate-like member extending in the Y-axis direction. Between auxiliary carriage 35 and auxiliary guide frame 24, a Y linear guide device 33a for straightly guiding auxiliary carriage 35 in the Y-axis direction is provided.

As illustrated in FIG. 2, Y coarse movement stage 30 has a pair of X beams 32. The pair of X beams 32 are each made up of a member extending in the X-axis direction and having a rectangular YZ cross section, and disposed parallel to each other at a predetermined spacing in the Y-axis direction. To the lower surface of each of both end vicinity parts of X beams 32 in the longitudinal direction, Y carriage 34 described previously is fixed. Consequently, the pair of X beams 32 are integrally driven with a predetermined stroke in the Y-axis direction, on the pair of base frames 22. The center parts in the longitudinal direction of the pair of X beams 32 are connected by auxiliary carriage 35 described above (not illustrated in FIG. 2, see FIG. 1).

Figure 3A:
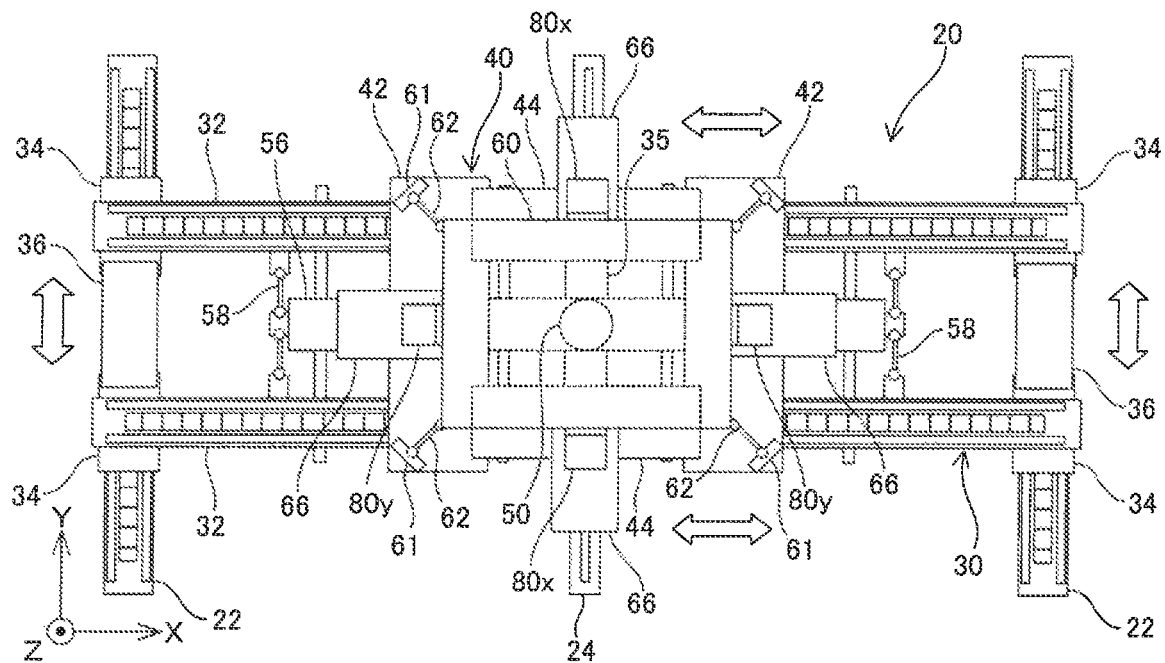
FIG. 3A is a plan view of the substrate stage device in a state where a substrate holder and a substrate carrier are removed.

As illustrated in FIG. 3A, X coarse movement 40 has a pair of X tables 42. The pair of X tables 42 are each made up of a plate-like member having a rectangular shape in planar view, and are disposed parallel to each other, spaced apart in the X-axis direction. Each of the pair of X tables 42 is bridged over the pair of X beams 32. Between X table 42 and X beam 32, as illustrated in FIG. 1, an X drive system 43 is provided that includes an X linear guide device for straightly guiding X table 42 in the X-axis direction, an X actuator (e.g. a linear motor) for driving X table 42 with a predetermined stroke in the X-axis direction and an X linear encoder used to obtain X-position information of X table 42 (a part of the elements is not illustrated).

Referring back to FIG. 3A, the pair of X tables 42 are coupled by a pair of coupling plates 44. The pair of coupling plates 44 are each made up of a plate-like member extending in the X-axis direction and having a rectangular shape in planar view, and are disposed spaced apart from each other in the Y-axis direction. Consequently, the pair of X tables 42 are integrally driven with a predetermined stroke in the X-axis direction, on the pair of X beams 32. Further, the pair of X tables 42 are moved integrally with the pair of X beams 32 by the action of the X linear guide device that X drive system 43 described above (see FIG. 1) has.

Weight cancel device 50 is disposed in an opening section defined by the pair of X tables 42 and the pair of coupling plates 44. Weight cancel device 50 is configured similar to the configuration of a weight cancel device disclosed in, for example, U.S. Patent Application Publication No. 2010/0018950, and supports the self-weight of a system including substrate table 60 and substrate holder 68 (not illustrated in FIG. 3A, see FIG. 4) by generating an upward force in the gravity direction. As illustrated in FIG. 4, weight cancel device 50 is mechanically connected to X coarse movement stage 40 at its gravity height position via a plurality of flexures 52, in a state of being vibrationally separated from X coarse movement stage 40 in a direction intersecting an XY plane. Weight cancel device 50 is towed by X coarse movement stage 40 via at least one of the plurality of flexures 52, thereby being moved integrally with X coarse movement stage 40 in at least one of the X-axis direction and the Y-axis direction.

Y step guide 56 is made up of a member extending in the X-axis direction and having a rectangular YZ cross section, and disposed between the pair of X beams 32. Weight cancel device 50 described above is placed on Y step guide 56 in a noncontact state via, for example, an air bearing. Y step guide 56 is straightly guided in the Y-axis direction via a plurality of Y linear guide devices 19 configured of a plurality of Y linear guides 19a fixed to the upper surfaces of stage stands 18 and a plurality of Y slide members 19b (which overlap in the depth direction of the page surface) fixed to the lower surface of Y step guide 56.

Referring back to FIG. 3A, Y step guide 56 is mechanically connected to the pair of X beams 32 via a plurality of flexures 58, and is moved integrally with X coarse movement stage 40 in the Y-axis direction. In the case where X coarse movement stage 40 is moved only in the X-axis direction, weight cancel device 50 is moved in the X-axis direction on Y step guide 56 in a static state, whereas, in the case where X coarse movement stage 40 is moved in the Y-axis direction (including the case of involving the movement in the X-axis direction), weight cancel device 50 is moved together with Y step guide 56 in the Y-axis direction. Consequently, weight cancel device 50 does not fall from Y step guide 56, regardless of its position.

Substrate table 60 is made up of a member having a rectangular shape in planar view with the X-axis direction serving as the longitudinal direction. As illustrated in FIG. 4, the center part of substrate table 60 is supported from below by weight cancel device 50 via a spherical bearing device 54. Spherical bearing device 54 supports substrate table 60 from below to be freely swingable (tilt-operable) in the θx direction and the θy direction. Spherical bearing device 54 is noncontactly supported from below by weight cancel device 50 via an air bearing (not illustrated), and is relatively movable with respect to weight cancel device 50 along the horizontal plane (the XY plane). Note that a quasispherical bearing device as disclosed in, for example, U.S. Patent Application Publication No. 2010/0018950 may be used, instead of spherical bearing device 54.

As illustrated in FIG. 3A, substrate table 60 is mechanically connected to X coarse movement stage 40 via a plurality (e.g. four in the present embodiment) of flexures 62. Flexure 62 is connected to a support column 61 that has one end connected to a corner part of substrate table 60 and the other end connected to a corner part of coarse movement stage 40. Flexure 62 includes a steel plate disposed almost parallel to the XY plane and a hinged joint device (e.g. a ball joint) disposed at both ends of the steel plate, and flexures 62 constrain substrate table 60 with respect to X coarse movement stage 40 in directions parallel to the XY plane (the X-axis direction, the Y-axis direction and the θz direction) and causes substrate table 60 to be in a state of relatively movable with respect to X coarse movement stage 40 in a minute range in directions intersecting the XY plane (the Z-axis direction, the θx direction and the θy direction). Substrate table 60 is towed by X coarse movement stage 40, for example, via any one of the four flexures 62, thereby being moved integrally with X coarse movement stage 40 in at least one of the X-axis direction and the Y-axis direction.

As illustrated in FIG. 4, substrate table 60 is finely driven with respect to X coarse movement stage 40 in the Z-axis direction, the θx direction and the θy direction (hereinafter, referred to as Z-tilt directions) via a plurality of Z voice coil motors 64. In the present embodiment, for example, four Z voice coil motors 64 are provided corresponding to the four corner parts of substrate table 60, but the number of the Z voice coil motors is not limited thereto, and at least three Z voice coil motors 64 that do not lie in a same straight line have only to be provided. Positional information of substrate table 60 in the Z-tilt directions is obtained by a main controller (not illustrated) using a plurality of Z sensors 65 that include probes 65a fixed to the lower surface of substrate table 60 and targets 65b fixed to weight cancel device 50. For example, four (at least three) Z sensors 65 are disposed at a predetermined spacing around an axis line parallel to the Z-axis. The main controller (not illustrated) performs Z-tilt position control of substrate table 60 (i.e. substrate P) on the basis of the outputs of the plurality of Z sensors 65 described above.

As illustrated in FIG. 3A, on the lower surface of substrate table 60, a plurality (e.g. four in the present embodiment) of guide plates 66 are fixed in a cantilevered state (see FIG. 4). For example, the four guide plates 66 are disposed protruding radially (in a cross shape) from ends on the +X side, the −X side, the +Y side and the −Y side of substrate table 60, respectively, toward the outside of substrate table 60. The upper surfaces of guide plates 66 are finished so as to have a high degree of flatness.

A Y stator 80y is fixed to each of the center parts of the side surfaces on the +X side and the −X side of substrate table 60. Further, an X stator 80x is fixed to each of the center parts of the side surfaces on the +Y side and the −Y side of substrate table 60.

Figure 3B:
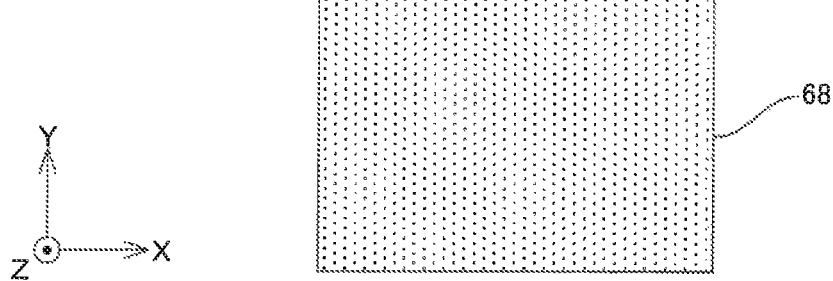
FIG. 3B is a plan view of the substrate holder alone.

As illustrated in FIG. 3B, substrate holder 68 serving as a support member to support substrate P is made up of a plate-like member having a rectangular shape in planar view with the X-axis direction serving as the longitudinal direction, and as illustrated in FIG. 4, substrate holder 68 is fixed on the upper surface of substrate table 60. The sizes of substrate holder 68 in the longitudinal direction and the width direction are set longer than those of substrate table 60 in the longitudinal direction and the width direction, respectively, and yet set to around the same as (actually, slightly shorter than) those of substrate P in the longitudinal direction and the width direction, respectively. Substrate P is placed on the upper surface of substrate holder 68. On the upper surface of substrate holder 68, a plurality of minute hole sections (not illustrated) are formed.

A pressurized gas supply device that supplies pressurized gas (e.g. air) and a vacuum suction device (both of the devices are not illustrated) are connected to substrate holder 68. Substrate holder 68 blows out the pressurized gas (the compressed air) supplied from the pressurized gas supply device described above to the lower surface of substrate P via a part of the plurality of minute hole sections described above, thereby interposing the gas between the lower surface of substrate P and the upper surface of substrate holder 68 (i.e., forming a gas film). Further, substrate holder 68 causes a downward force in the gravity direction (a preload) to act on substrate P by suctioning the gas between the upper surface of substrate holder 68 and the lower surface of substrate P via the plurality of minute hole sections using the vacuum suction device described above, thereby imparting the rigidity in the gravity direction to the gas film described above.

Then, while levitating and noncontactly supporting substrate P via a minute clearance in the gravity direction (the Z-axis direction) by a balance between the pressure and the flowrate of the pressurized gas and the vacuum suction force, substrate holder 68 causes a force for controlling the flatness degree of substrate P (e.g. a force rectifying or correcting the flatness degree) to act on substrate P. Consequently, substrate holder 68 constrains substrate P in the Z-tilt directions, whereas substrate holder 68 does not constrain substrate P in directions of three degrees of freedom within the horizontal plane. Further, substrate holder 68 can control the spacing between substrate P and substrate holder 68 by balance adjustment (hereinafter, referred to as "air adjustment") between the blowing-out (the gas supply) of the pressurized gas and the vacuum suction (the gas suction). Further, this air adjustment can be controlled in response to the position of the upper surface of substrate holder 68. Note that substrate holder 68 is disposed so as to be capable of supporting at least a part, corresponding to a shot area (i.e. an area onto which a pattern of mask M is transferred) on substrate P, of the lower surface of substrate P. Therefore, it is preferable that the upper surface of substrate holder 68 for supporting substrate P has a size capable of supporting at least one shot area formed on substrate P. Note that, in the present embodiment, substrate P is noncontactly supported while the downward force in the gravity direction is caused to act on substrate P by using the blowing-out of the pressurized gas and the vacuum suction together, but this is not intended to be limiting, and for example, substrate P may be noncontactly supported while the downward force in the gravity direction is caused to act on substrate P utilizing the Bernoulli effect by passing a gas with high speed between substrate P and substrate holder 68.

Figure 3C:
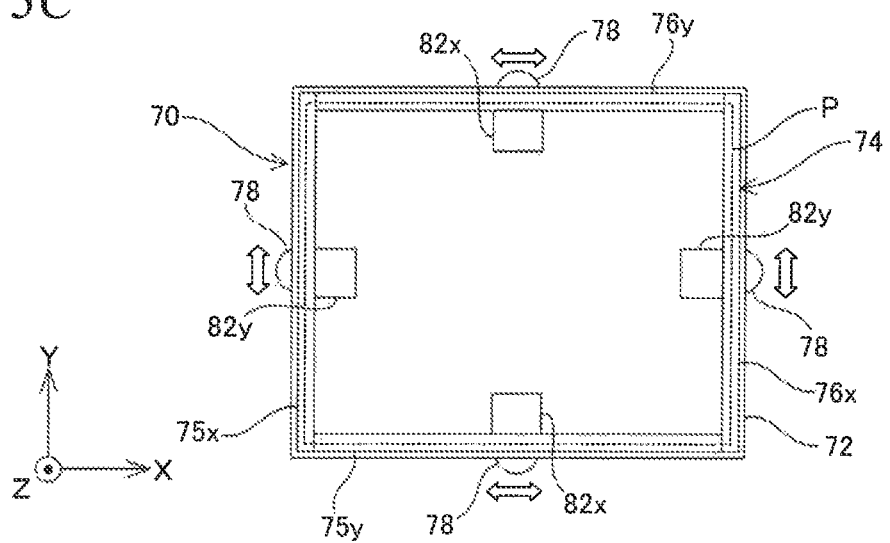
FIG. 3C is a plan view of the substrate carrier alone.

As illustrate in FIG. 3C, substrate carrier 70 has a base 72 and a carrier main body 74. Base 72 is made up of a frame-like member having a rectangular shape in planar view (when viewed from the +Z direction). In an opening section having a rectangular shape in planar view formed in base 72, as illustrated in FIG. 4, substrate table 60 is disposed.

Referring back to FIG. 3C, for example, four air bearings 78, corresponding to, for example, the four guide plates 66 fixed to substrate table 60 described above (see FIG. 3A for each of them), are fixed to the lower surface of base 72. For example, the four air bearings 78 have the respective air bearing surfaces (the gas blowing-out surfaces) that are disposed facing the upper surfaces of the corresponding guide plates 66 (see FIG. 4), and the four air bearings 78 blow out the pressurized gas (e.g. the compressed air) from the air bearing surfaces described above to the upper surfaces of the corresponding guide plates 66. As illustrated in FIG. 2, base 72 is levitated on the four guide plates 66 via a minute clearance, for example, by the static pressure of the pressurized gas blown out from the four air bearings 78 to the corresponding guide plates 66, respectively.

Referring back to FIG. 3C, to the wall surfaces that define the opening section of base 72, a pair of X movers 82x and a pair of Y movers 82y are fixed corresponding to a pair of X stators 80x and a pair of Y stators 80y (see FIG. 3A for each of them) that are fixed to the side surfaces of substrate table 60 described above. As illustrated in FIG. 4, Y stator 80y and Y mover 82y corresponding to the Y stator 80y configure a Y voice coil motor 84y (see FIG. 2) of an electromagnetic force drive method. Similarly, X stator 80x (see FIG. 3A) and X mover 82x (see FIG. 3C) corresponding to the X stator 80x configure an X voice coil motor 84x (see FIG. 2) of an electromagnetic force drive method.

Referring back to FIG. 3C, carrier main body 74 is made up of a frame-like member having a rectangular shape in planar view, and has an X bar mirror 75x, a Y bar mirror 75y, an X support section 76x and a Y support section 76y. X bar mirror 75x is made up of a bar-like member extending in the Y-axis direction and having a rectangular XZ cross-sectional shape, and has a reflection surface formed on the surface on the −X side. Y bar mirror 75y is made up of a bar-like member extending in the X-axis direction and having a rectangular YZ cross-sectional shape, and has a reflection surface formed on the surface on the −Y side. Note that X bar mirror 75x and Y bar mirror 75y may be configured by fixing a long mirror to a bar-like member.

X support section 76x is made up of a bar-like member extending in the Y-axis direction and having a rectangular XZ cross-sectional shape, and Y support section 76y is made up of a bar-like member extending in the X-axis direction and having a rectangular YZ cross-sectional shape. The length and the cross-sectional shape of X support section 76x are set to almost the same as those of X bar mirror 75x, and the length and the cross-sectional shape of Y support section 76y are set to almost the same as those of Y bar mirror 75y. The end vicinity part on the −Y side of X bar mirror 75x and the end vicinity part on the −X side of Y bar mirror 75y are connected to each other, and the end vicinity part on the +Y side of X bar mirror 75x and the end vicinity part on the −X side of Y support section 76y are connected to each other. Further, the end vicinity part on the +X side of Y bar mirror 75y and the end vicinity part on the −Y side of X support section 76x are connected to each other, and the end vicinity part on the +X side of Y support section 76y and the end vicinity part on the +Y side of X support section 76x are connected to each other.

Carrier main body 74 is placed on the upper surface of base 72 and fixed to base 72. The wall surfaces that define the opening section in base 72 and the wall surfaces that define the opening section in carrier main body 74 are almost flush with each other, as illustrated in FIG. 4. In the opening section of carrier main body 74, substrate holder 68 is disposed.

As illustrated in FIG. 2, substrate P is placed on carrier main body 74. Each of the end vicinity parts on the +X side, the −X side, the +Y side and the −Y side of substrate P serves as an area (hereinafter, referred to as "a margin area") onto which a mask pattern is not transferred, and the length of each of X bar mirror 75x, Y bar mirror 75y, X support section 76x and Y support section 76y and the distance between the wall surfaces that define the opening section are set so that the margin areas described above are supported from below by carrier main body 74 in a state where substrate P is placed on carrier main body 74. Further, on the upper surface of each of X bar mirror 75x, Y bar mirror 75y, X support section 76x and Y support section 76y, a plurality of minute hole sections (not illustrated) are formed. Carrier main body 74 is connected to a vacuum suction device (not illustrated), and can adsorb and hold the margin areas of substrate P via the plurality of hole sections described above.

The main controller (not illustrated) finely drives substrate carrier 70 with respect to substrate table 60, in the X-axis direction via the pair of X voice coil motors 84x described above, and in the Y-axis direction via the pair of Y voice coil motors 84y described above. Further, the main controller (not illustrated) finely drives substrate carrier 70 with respect to substrate table 60 in the θz direction via the pair of X voice coil motors 84x (or the pair of Y voice coil motors 84y). Between the wall surfaces that define the opening sections in carrier main body 74 and the side surfaces of substrate holder 68, such a clearance is formed that prevents the wall surfaces and the side surfaces from coming into contact with each other even when substrate carrier 70 is finely driven with respect to substrate table 60 in the directions of three degrees of freedom within the horizontal plane (the X-axis direction, the Y-axis direction and the θz direction). The Z-position (the height position) of each of the pair of X voice coil motors 84x and the pair of Y voice coil motors 84y roughly coincides with the gravity height position of substrate carrier 70, and when causing a thrust to act on substrate carrier 70 in the foregoing directions of three degrees of freedom within the horizontal plane via the pair of X voice coil motors 84x and the pair of Y voice coil motors 84y, substrate carrier 70 is suppressed from rotating in the θx direction or the θy direction.

Further, when integrally driving X coarse movement stage 40 (not illustrated in FIG. 2, see FIG. 3A) and substrate table 60 with a predetermined long stroke in at least one of the X-axis direction and the Y-axis direction, the main controller (not illustrated) provides substrate carrier 70 with a thrust (acceleration) as needed in at least one of the X-axis direction and the Y-axis direction via the pair of X voice coil motors 84x and the pair of Y voice coil motors 84y described above. With this operation, substrate carrier 70 disposed noncontactly on a plurality (e.g. four) of guide plates 66 fixed to substrate table 60, via a plurality (e.g. four) of air bearings 78, is moved integrally with substrate table 60 with a predetermined long stroke in at least one of the X-axis direction and the Y-axis direction. Further, when substrate table 60 is moved with a long stroke in the Y-axis direction, the main controller (not illustrated) finely drives substrate carrier 70 as needed in the X-axis direction and the θz direction using the pair of X voice coil motors 84x, and also when substrate table 60 is moved with a long stroke in the X-axis direction, the main controller finely drives substrate carrier 70 as needed in the Y-axis direction and the θz direction using the pair of Y voice coil motors 84y, thereby performing the positioning of substrate P. Further, in the cases such as where the autofocus control that is known to public is performed, the main controller (not illustrated) drives substrate table 60 as needed in the Z-tilt directions, thereby performing the Z-tilt position control of substrate P. On this operation, substrate table 60 (and substrate holder 68) and substrate P are integrally moved in the Z-tilt directions, on the basis of the rigidity of the gas film interposing between substrate P and substrate holder 68. Further, substrate carrier 70 is also moved integrally with substrate table 60 (i.e. substrate P) in the Z-tilt directions on the basis of the rigidity of the gas film interposing between air bearings 78 and guide plates 66 corresponding thereto.

Positional information of substrate carrier 70 in the X-axis direction and the Y-axis direction is obtained by a substrate interferometer system. The substrate interferometer system has an X laser interferometer and a Y laser interferometer (not illustrated). The X layer interferometer and the Y laser interferometer are each fixed to an apparatus main body (in other words, a stand) that supports projection optical system 16 and the like. The X laser interferometer irradiates an X reference mirror (not illustrated) with a reference beam and receives its reflection beam, and also irradiates the reflection surface of X bar mirror 75x with a length measurement beam and receives its reflection beam. The X laser interferometer obtains displacement amount information of the X-position of the reflection surface of X bar mirror 75x with the X reference mirror serving as a datum, on the basis of interference between the respective reflection beams of the reference beam and the length measuring beams described above. Similarly, the Y laser interferometer also irradiates the reflection surface of Y bar mirror 75y with a length measuring beam and receives its reflection beam, thereby obtaining displacement amount information of the Y-position of the reflection surface of Y bar mirror 75y with the Y reference mirror serving as a datum. The outputs of the X laser interferometer and the Y laser interferometer are supplied to the main controller (not illustrated). At least one of the X laser interferometer and the Y laser interferometer irradiates the corresponding bar mirror with a plurality of length measuring beams within the horizontal plane, and the main controller obtains rotation amount information of substrate carrier 70 in the θz direction on the basis of the plurality of length measuring beams.

In liquid crystal exposure apparatus 10 (see FIG. 1) configured as described above, under the control of the main controller (not illustrated), mask M is loaded onto mask stage 14 by a mask loader (not illustrated) and also substrate P is loaded onto substrate stage device 20 by a substrate loader (not illustrated). After that, the main controller implements alignment measurement using an alignment detection system (not illustrated), and after the alignment measurement has been completed, an exposure operation of a step-and-scan method is performed. Note that since this exposure operation is similar to the exposure operation of a step-and-scan method that has conventionally been performed, the detailed explanation will be omitted here.

Here, as is described above, in substrate stage device 20, the control (the air adjustment control) of each of the quantity and the pressure of the pressurized gas blown out from substrate holder 68 and the vacuum suction force is performed as needed in order to control the flatness degree of substrate P, but the air adjustment control needs not be performed in parallel with the position control of substrate P within the horizontal plane in the scan exposure operation described above. That is, the setting value of the air adjustment control that matches the surface property of at least one of substrate P and substrate holder 68 (undulation or variation in thickness of substrate P) is obtained beforehand, for example, with respect to each of substrates P to be exposed, before the scan exposure operation, and the air adjustment control is performed on the scan exposure operation on the basis of the setting value. In this case, it is favorable that before the scan exposure operation, for example, the surface position (the height position) information of substrate P is obtained using a surface position measurement system (e.g. an autofocus sensor or a noncontact displacement gauge), and on the basis of the surface position information, the setting value of the air adjustment control is obtained beforehand so that the flatness degree of substrate P is controlled (e.g. rectified or corrected). Note that the setting value of the air adjustment control may be obtained using a substrate serving as a datum, without using substrate P to be exposed actually. Further, the control of the flatness degree of substrate P is not limited to the control tending to rectify the substrate to a flat surface, but may include control for correcting the surface into a state of having a deviation in a desirable property with respect to a flat surface or with respect to the upper surface of substrate holder 68.

According to substrate stage device 20 related to the first embodiment described so far, substrate holder 68 serving as a first support member and substrate carrier 70 serving as a second support member are disposed noncontactly with each other and have structures physically (mechanically) separated from each other, and therefore, substrate carrier 70 and thus substrate P can be finely driven without driving substrate holder 68 and substrate P can be positioned with high accuracy. In this manner, in substrate stage device 20, it is not necessary to drive substrate holder 68 when finely driving substrate P, and an object to be driven on the fine driving is light in weight, and therefore substrate P can be finely driven with high speed and the positioning accuracy of substrate P can be improved, compared to the conventional art. Further, the configuration of a drive system (in the present embodiment, a drive system including the voice coil motors) for finely driving substrate carrier 70 (thus, substrate P) can be simplified (in other words, the necessary drive force can be reduced).

Note that the configuration of substrate stage device 20 related to the first embodiment described above can be changed as needed. Modified examples of substrate stage device 20 related to the first embodiment will be described below. Note that, in the modified examples of the first embodiment, elements that have the same configurations and functions as those of substrate stage device 20 of the first embodiment described above will be provided with the same reference signs as those in the first embodiment described above, and the description thereof will be omitted.

First Modified Example

Figure 5:
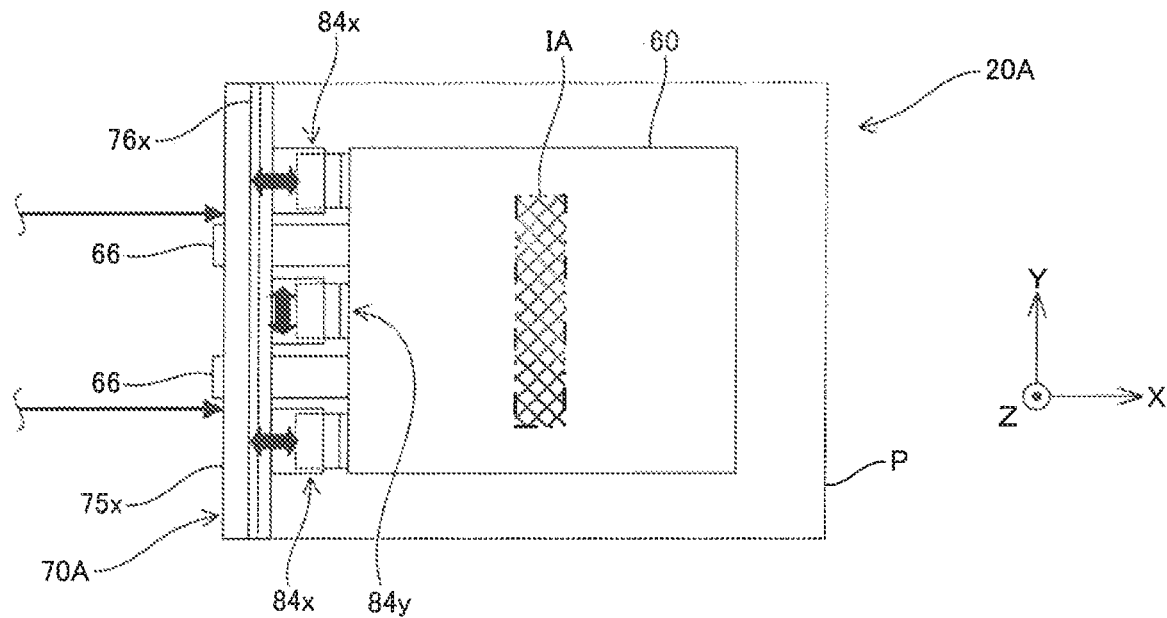
FIG. 5 is a view showing a substrate stage device related to a modified example (No. 1) of the first embodiment.

FIG. 5 shows a substrate stage device 20A related to a first modified example of the first embodiment described above. Note that from the viewpoint of avoiding intricacy of the drawings, in FIG. 5 (and FIGS. 6 to 11A related to the other modified examples to be described later), the illustration of substrate holder 68 (see FIG. 2), X coarse movement stage 40, Y coarse movement stage 30 (see FIG. 3A for each of the coarse movement stages) and the like is omitted. A substrate carrier 70A of substrate stage device 20A has X bar mirror 75x and X support section 76x. X bar mirror 75x and X support section 76x are each made up of a member extending in the Y-axis direction and having a rectangular XZ cross-sectional shape, and X bar mirror 75x is fixed to the side surface on the −X side of X support section 76x. X bar mirror 75x and X support section 76x are placed on a base 73 (not illustrated in FIG. 5, see FIG. 14), and are placed in a noncontact state on a pair of guide plates 66 that protrude from an end on the −X side of substrate table 60, via air bearings 78 attached to base 73. X support section 76x adsorbs and holds the margin area provided in the end vicinity on the −X side of substrate P, from below. That is, substrate carrier 70 (see FIG. 3C) of the first embodiment described above is formed into a rectangular frame-like shape and adsorbs and holds the entire outer peripheral part of substrate P, whereas substrate carrier 70A of the first modified example is made up of one bar-like member and adsorbs and holds only one end vicinity of substrate P.

In substrate stage device 20A, the highly accurate positioning of substrate carrier 70A (i.e. substrate P) with respect to exposure area IA in the directions of three degrees of freedom within the horizontal plane is performed by a pair of X voice coil motors 84x each of which is configured of a stator fixed to the side surface on the −X side of substrate table 60 and a mover fixed to the side surface on the +X side of base 73 (not illustrated in FIG. 5, see FIG. 14), and one Y voice coil motor 84y. Similarly to the first embodiment described above, positional information in the X-axis direction and rotation amount information in the 8z direction of substrate carrier 70A are obtained by a laser interferometer (not illustrated) using X bar mirror 75x. Positional information in the Y-axis direction of substrate carrier 70A should be obtained using a laser interferometer system or a linear encoder system (both of which are not illustrated). According to substrate stage device 20A, since substrate carrier 70A has a simpler configuration and is lighter in weight than the substrate carrier of the first embodiment described above, position controllability of substrate P is improved. Further, the margin area only has to be set on the −X side of substrate P, which allows for the high efficiency.

Second Modified Example

Figure 6:
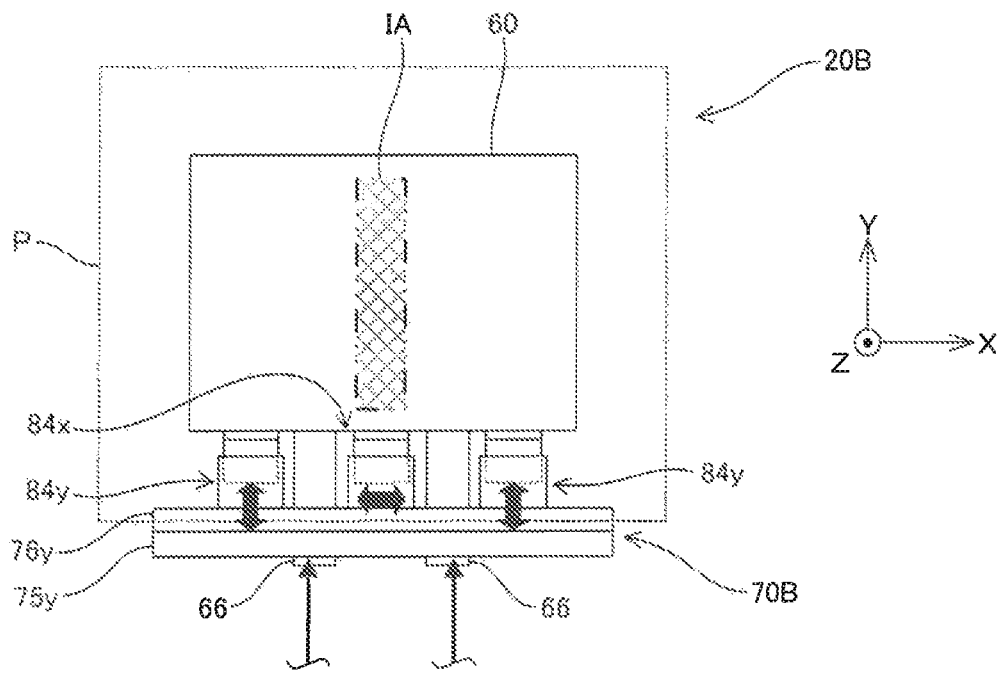
FIG. 6 is a view showing a substrate stage device related to a modified example (No. 2) of the first embodiment.

FIG. 6 shows a substrate stage device 20B related to a second modified example of the first embodiment described above. The end vicinity part on the −X side of substrate P is held by substrate carrier 70A in the first modified example described above (see FIG. 5), whereas the end vicinity on the −Y side of substrate P is held by a substrate carrier 70B in the present second modified example. Since the configuration and functions of substrate carrier 70B are substantially the same as those of substrate carrier 70A (see FIG. 5) related to the first modified example described above except for the disposition being different, the description thereof will be omitted. Also in substrate stage device 20B related to the present second modified example, the similar effect to the first modified example described above can be obtained.

Third Modified Example

Figure 7:
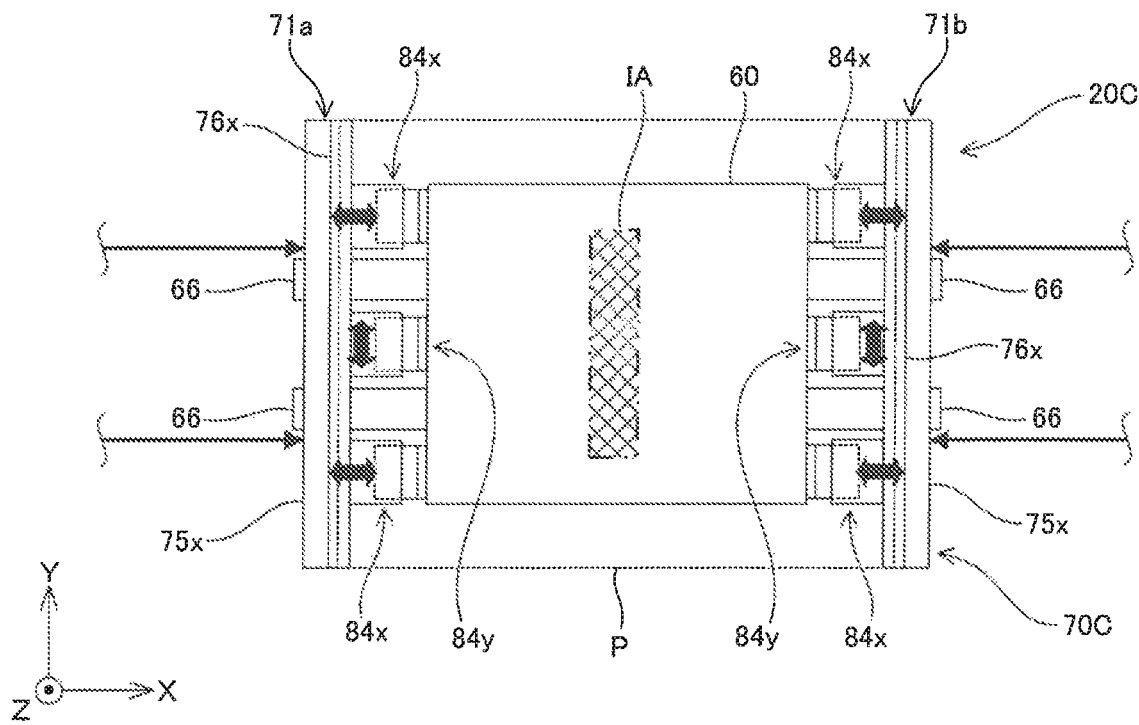
FIG. 7 is a view showing a substrate stage device related to a modified example (No. 3) of the first embodiment.

FIG. 7 shows a substrate stage device 20C related to a third modified example of the first embodiment described above. A substrate carrier 70C related to the present third modified example has a first carrier 71a and a second carrier 71b. The first carrier 71a includes a drive system and a measurement system, and is a member having substantially the same configuration as substrate carrier 70A (see FIG. 5) related to the first modified example described above and adsorbs and holds the end vicinity part on the −X side of substrate P. The second carrier 71b is a member having a configuration laterally symmetric with the first carrier 71a on the page surface of the drawing, and adsorbs and holds the end vicinity part on the +X side of substrate P. Substrate carrier 70C can control the position of the first carrier 71a and the position of the second carrier 71b independently from each other, and therefore can suppress the bending by imparting the tension to substrate P.

Fourth Modified Example

Figure 8:
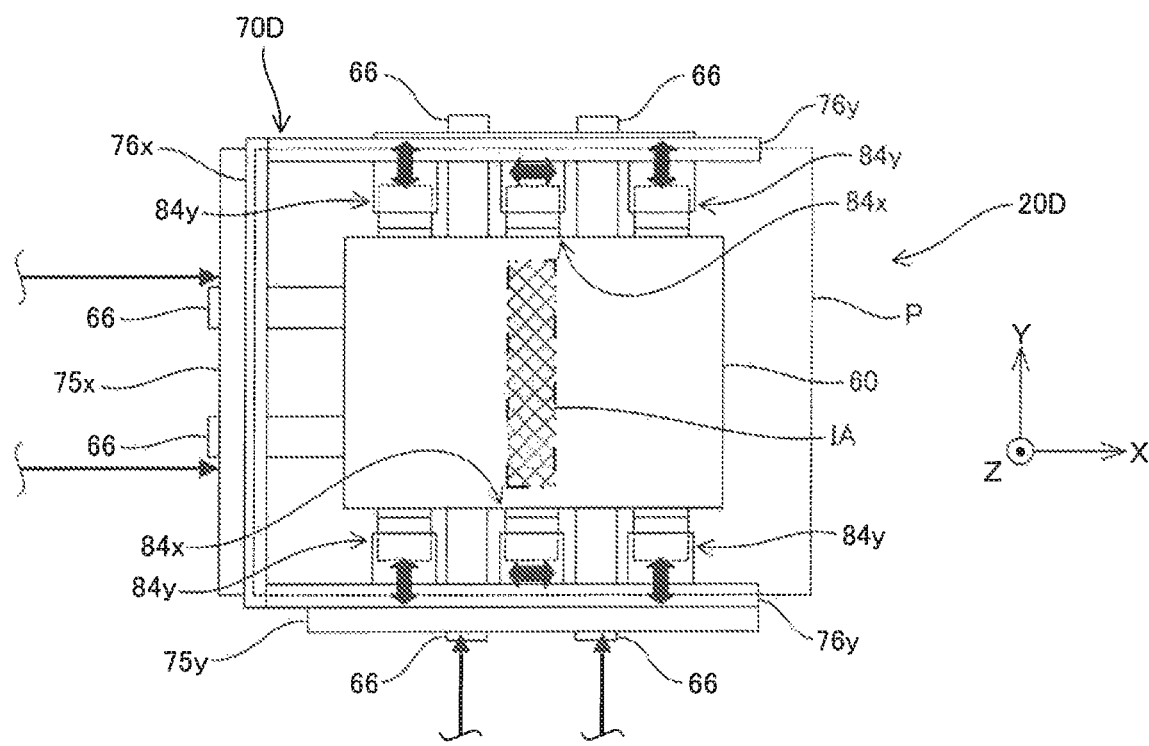
FIG. 8 is a view showing a substrate stage device related to a modified example (No. 4) of the first embodiment.

FIG. 8 shows a substrate stage device 20D related to a fourth modified example of the first embodiment described above. A substrate carrier 70D related to the present fourth modified example includes one X support section 76x and a pair of Y support sections 76y, is formed into an U-like shape in planar view, and adsorbs and holds the margin areas provided in the respective end vicinity parts on the −X side, the +Y side and the −Y side of substrate P. X bar mirror 75x and Y bar mirror 75y are fixed to X support section 76x and Y support section 76y on the −Y side, respectively. Positional information of substrate carrier 70D within the horizontal plane is obtained by a laser interferometer (not illustrated) using X bar mirror 75x and Y bar mirror 75y described above. The highly accurate positioning of substrate carrier 70D with respect to exposure area IA in the directions of three degrees of freedom within the horizontal plane is performed by, for example, two of X voice coil motors 84x and, for example, four in total of Y voice coil motors 84y. Note that the disposition of the voice coil motors can be changed as needed, and for example, may be the similar disposition to the first modified example described above as illustrated in FIG. 5.

Fifth Modified Example

Figure 9:
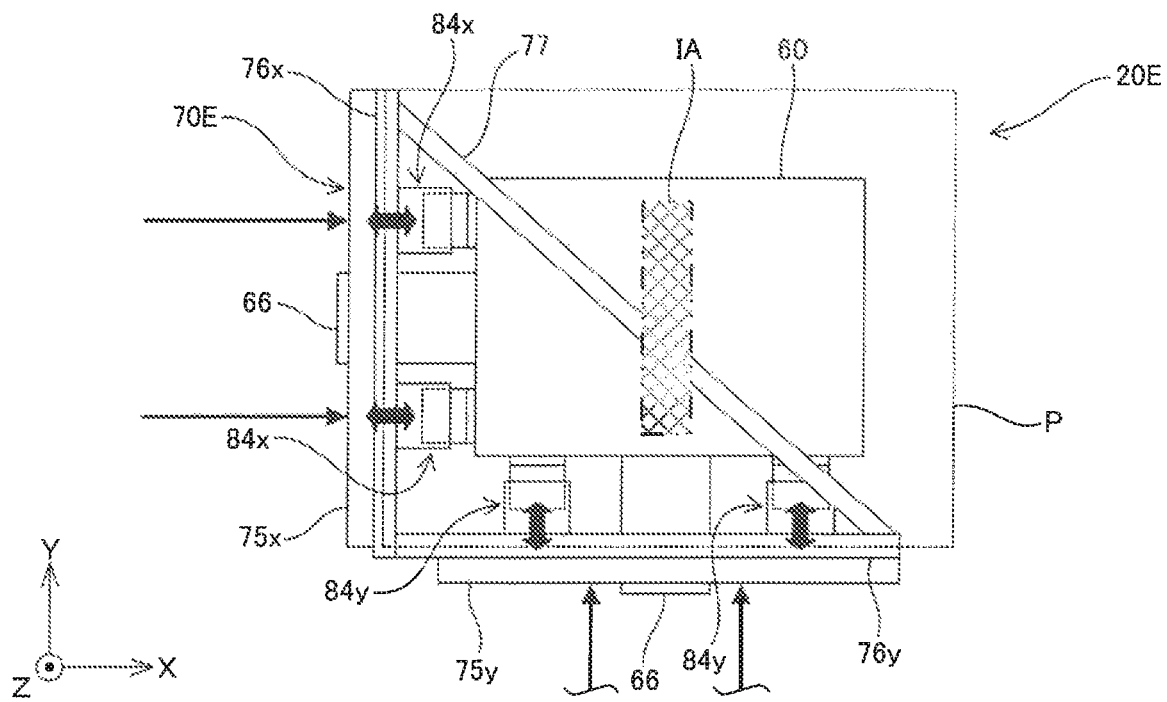
FIG. 9 is a view showing a substrate stage device related to a modified example (No. 5) of the first embodiment.

FIG. 9 shows a substrate stage device 20E related to a fifth modified example of the first embodiment described above. A substrate carrier 70E related to the present fifth modified example includes X support section 76x that holds the end vicinity part on the −X side of substrate P and Y support section 76y that holds the end vicinity part on the −Y side of substrate P. The end vicinity part on the −Y side of X support section 76x and the end vicinity part on the −X side of Y support section 76y are connected to each other, and the end vicinity part on the +Y side of X support section 76x and the end vicinity part on the +X side of Y support section 76y are connected to each other by a bar-like connecting member 77. Accordingly, substrate carrier 70E is formed into a triangle frame-like shape in planar view, and the orthogonality between the respective reflection surfaces of X bar mirror 75x and Y bar mirror 75y can be kept. Connecting member 77 may have a configuration passing below a substrate holder (not illustrated) or have a configuration passing above the substrate holder. Although the highly accurate positioning of substrate carrier 70E with respect to exposure area IA in the directions of three degrees of freedom within the horizontal plane is performed using a pair of X voice coil motors 84x and a pair of Y voice coil motors 84y, the disposition of the voice coil motors can be changed as needed, and for example, may be the similar disposition to the first modified example described above as illustrated in FIG. 5.

Sixth Modified Example

Figure 10:
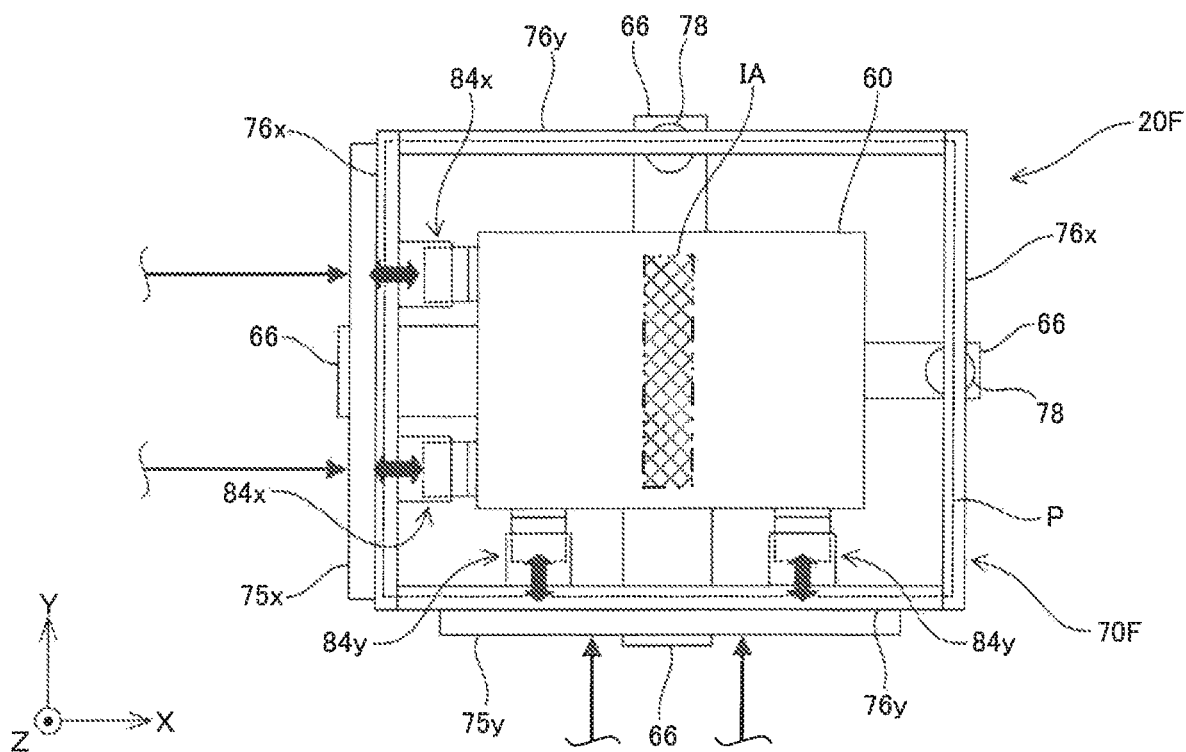
FIG. 10 is a view showing a substrate stage device related to a modified example (No. 6) of the first embodiment.

FIG. 10 shows a substrate stage device 20F related to a sixth modified example of the first embodiment described above. In substrate stage device 20F related to the present sixth modified example, a pair of X voice coil motors 84x for finely driving a substrate carrier 70F in the X-axis direction are disposed on the −X side of substrate table 60, and a pair of Y voice coil motors 84y for finely driving substrate carrier 70F in the Y-axis direction are disposed on the −Y side of substrate table 60. Also in substrate stage device 20F related to the present sixth modified example, the similar effect to the first embodiment described above can be obtained.

Seventh Modified Example

Figure 11A:
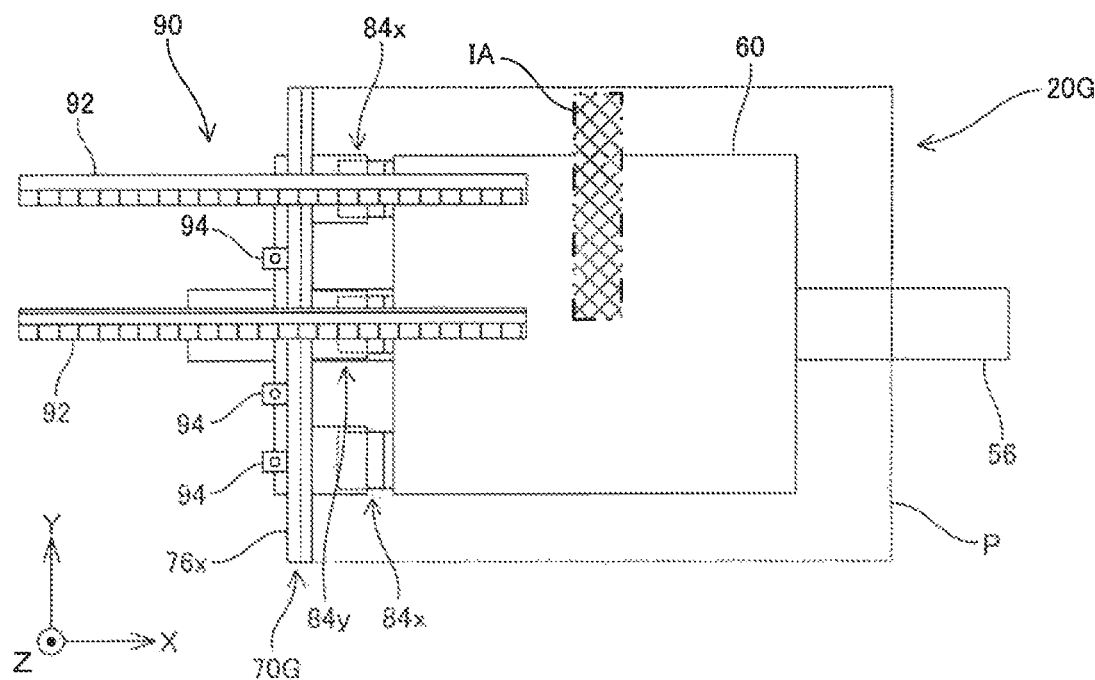
FIG. 11A is a plan view of a substrate stage device related to a modified example (No. 7) of the first embodiment.
Figure 11B:
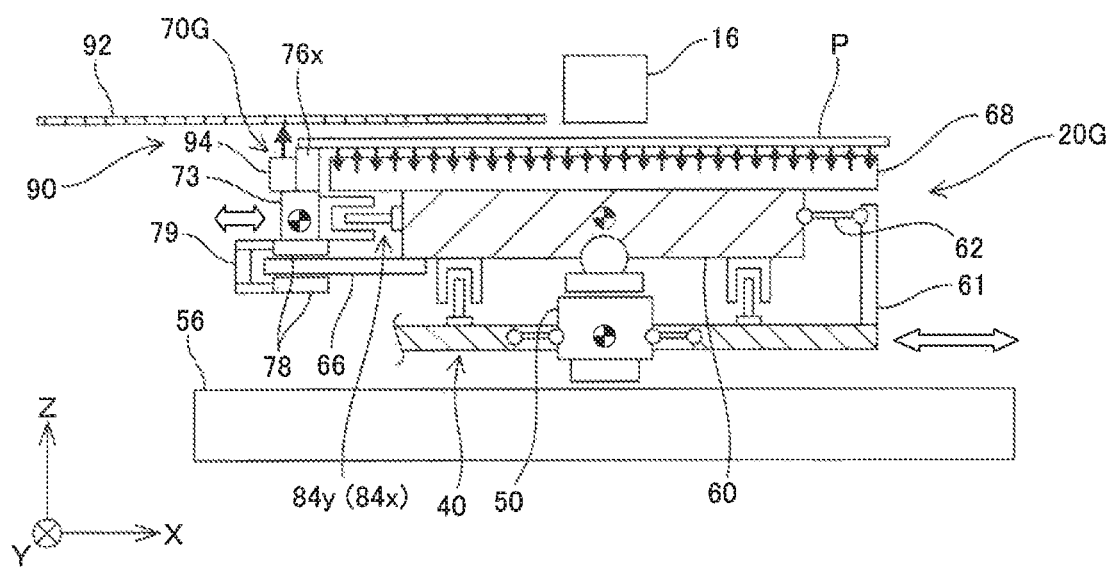
FIG. 11B is a cross-sectional view of the substrate stage device shown in FIG. 11A.

FIGS. 11A and 11B show a substrate stage device 20G related to a seventh modified example of the first embodiment described above. In substrate stage device 20G related to the present seventh modified example, positional information of a substrate carrier 70G in the directions of three degrees of freedom within the horizontal plane is obtained by an encoder system 90. Encoder system 90 is equipped with a pair of two-dimensional scales 92 and a plurality of encoder heads 94. The pair of two-dimensional scales 92 are each made up of a band-like member extending in the X-axis direction, and are disposed parallel to each other at a predetermined spacing in the Y-axis direction. The pair of two-dimensional scales 92 are fixed to the apparatus main body that supports projection optical system 16 (not illustrated in FIG. 11A). In two-dimensional scale 92, an X diffraction grating (an X grating) configured of a plurality of grid lines with the X-axis direction serving as a period direction and a Y diffraction grating (a Y grating) configured of a plurality of grid lines with the Y-axis direction serving as a period direction are formed. The X grating and the Y grating may be individually formed in areas different from each other of two-dimensional scale 92, or may be formed in the same area.

Substrate carrier 70G has a configuration in which one X support section 76x that adsorbs and holds the end vicinity part on the −X side of substrate P is finely driven with respect to substrate table 60 in the directions of three degrees of freedom within the horizontal plane, by a pair of X voice coil motors 84x and one Y voice coil motor 84y, and the plurality of encoder heads 94 are fixed to X support section 76x. In the present seventh modified example, for example, five encoder heads 94 are provided at a predetermined spacing in the Y-axis direction. Note that in FIG. 11A, for example, two of the five encoder heads 94 are respectively hidden behind the pair of two-dimensional scales 92 on the depth side of the page surface. Further, in FIG. 11B, for example, the five encoder heads 94 overlap one another in the depth direction of the page surface. Note that the positional relationship between the pair of two-dimensional scales 92 and, for example, the five encoder heads 94 may be reversed.

In substrate stage device 20G, the Y-positions of, for example, the five encoder heads 94 and the pair of two-dimensional scales 92 are set so that two of, for example, the five encoder heads 94 face the pair of two-dimensional scales 92, respectively, on operations such as an exposure operation (the X scan operation) and an alignment operation. X encoder head 94 has an X head that configures an X linear encoder system together with the X grating of the facing two-dimensional scale 92, and a Y head that configures a Y linear encoder system together with the Y grating (both of which are not illustrated). Y-position information of substrate carrier 70G that moves with a long stroke in the Y-axis direction should be obtained by, for example, an optical interferometer system (not illustrated) or the like.

Further, in substrate carrier 70G of the present seventh modified example, as illustrated in FIG. 11B, a pair of air bearings 78 connected to each other by a connecting member 79 having a U-like XZ cross-sectional shape are disposed with guide plate 66 in between in a vertical direction, and cause the preload to act on the mutual gas films, but this configuration may be applied to the first embodiment described above and the other modified examples of the first embodiment described above. Note that, although substrate carrier 70G of the present seventh modified example has a configuration in which one X support section 76x adsorbs and holds the end vicinity part on the −X side of substrate P, the configuration is not limited thereto, and substrate carrier 70G may have a rectangular frame-like shape as in the first embodiment described above, or encoder system 90 may be applied to the first to the sixth modified examples described above.

Eighth Modified Example

Figure 12:
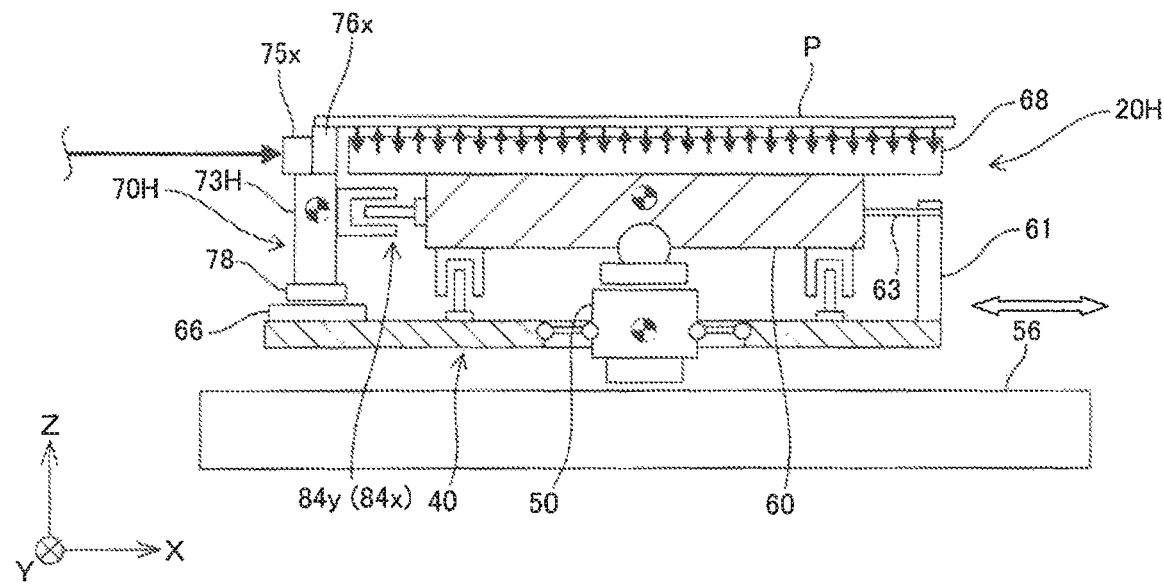
FIG. 12 is a view showing a substrate stage device related to a modified example (No. 8) of the first embodiment.

FIG. 12 shows a substrate stage device 20H related to an eighth modified example of the first embodiment described above. In substrate stage device 20H related to the present eighth modified example, the pressurized gas is blown out, to guide plate 66 fixed to the upper surface of X coarse movement stage 40, from air bearings 78 attached to the lower end of a base 73H that supports X bar mirror 75x and X support section 76x, and a substrate carrier 70H is levitated noncontactly on X coarse movement stage 40 by the static pressure of the pressurized gas. In substrate stage device 20H, substrate table 60 and X coarse movement stage 40 are connected by only a steel plate 63, instead of flexure 62 (see FIG. 4) including a hinged joint device.

Ninth Modified Example

Figure 13:
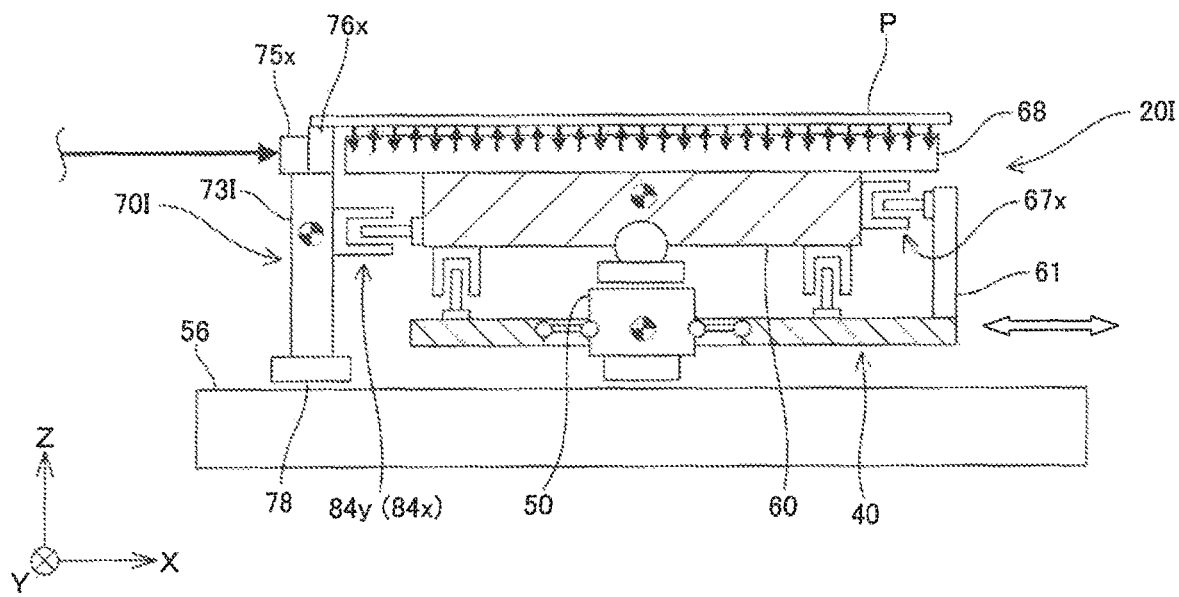
FIG. 13 is a view showing a substrate stage device related to a modified example (No. 9) of the first embodiment.

FIG. 13 shows a substrate stage device 20I related to a ninth modified example of the first embodiment described above. In substrate stage device 20I related to the present ninth modified example, the pressurized gas is blown out, to the upper surface of Y step guide 56, from air bearings 78 attached to the lower end of a base 73I that supports X bar mirror 75x and X support section 76x, and a substrate carrier 70I is levitated noncontactly on Y step guide 56 by the static pressure of the pressurized gas. Further, in substrate stage device 20I, substrate table 60 and substrate holder 68 are driven integrally with X coarse movement stage 40 in the X-axis direction and/or the Y-axis direction, by a thrust provided from an X voice coil motor 67x that is made up of a stator fixed to X coarse movement stage 40 and a mover fixed to substrate table 60, and a Y voice coil motor having a similar configuration (not illustrated). In substrate stage device 20I, the transmission of disturbance (vibration) from X coarse movement stage 40 to substrate table 60 can be suppressed. Note that a configuration may be employed in which the switching can be performed between a coupling state and a non-coupling state of X coarse movement stage 40 and substrate table 60, using a mechanical coupling device, and X coarse movement stage 40 and substrate table 60 may be mechanically coupled, for example, in the case where the transmission of the disturbance described above does not result in any problem.

Tenth Modified Example

Figure 14:
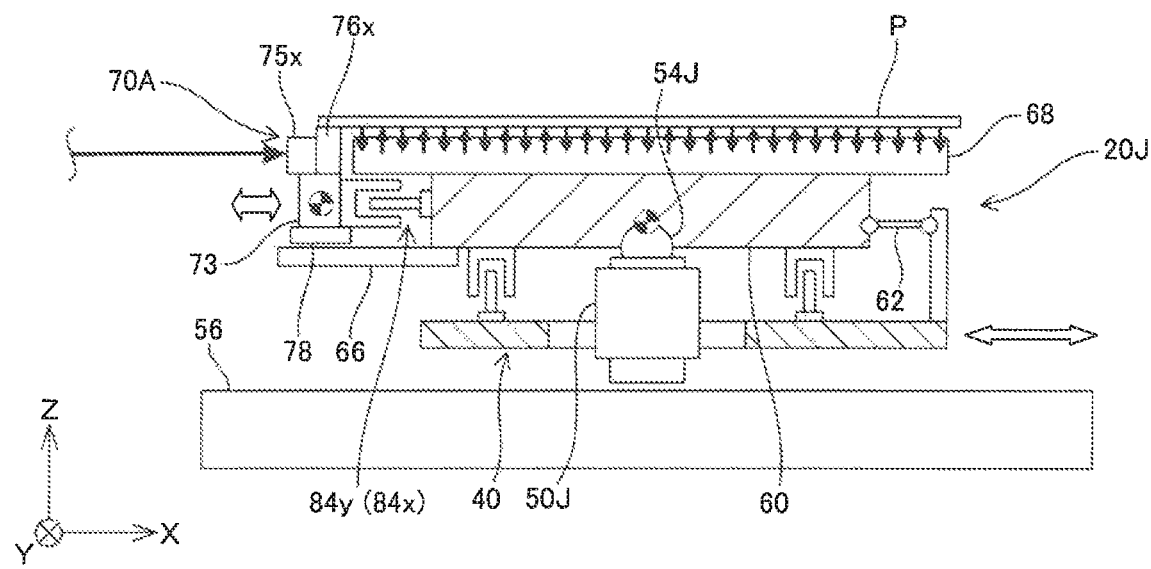
FIG. 14 is a view showing a substrate stage device related to a modified example (No. 10) of the first embodiment.

FIG. 14 shows a substrate stage device 20J related to a tenth modified example of the first embodiment described above. In substrate stage device 20J, a spherical bearing device 54J is integrally attached to a weight cancel device 50J because substrate table 60 and X coarse movement stage 40 are not relatively moved in a direction parallel to the horizontal plane. The configuration of substrate carrier 70A is the same as that in the first modified example described above (see FIG. 5).

Eleventh Modified Example

Figure 15:
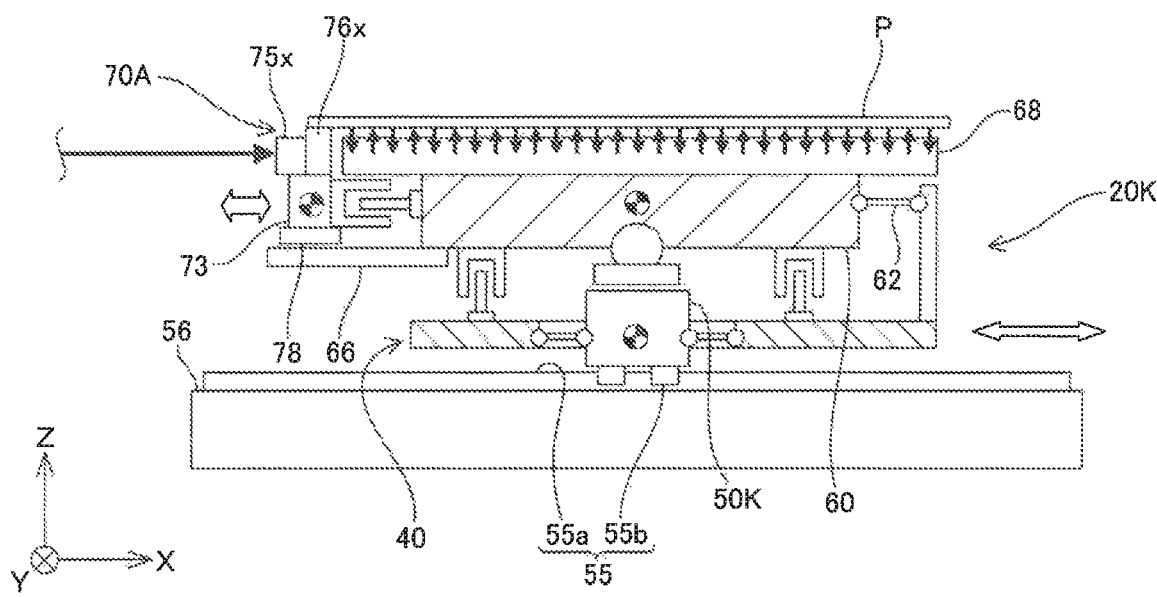
FIG. 15 is a view showing a substrate stage device related to a modified example (No. 11) of the first embodiment.

FIG. 15 shows a substrate stage device 20K related to an eleventh modified example of the first embodiment described above. In substrate stage device 20K, a weight cancel device 50K is mechanically guided linearly in the X-axis direction via an X linear guide device 55 that includes an X linear guide 55a fixed to the upper surface of Y step guide 56 and a plurality of X slide members 55b fixed to the lower surface of weight cancel device 50K. Since the configuration of substrate carrier 70A is the same as that in the first modified example (see FIG. 5), the description thereof will be omitted.

Twelfth Modified Example

Figure 16:
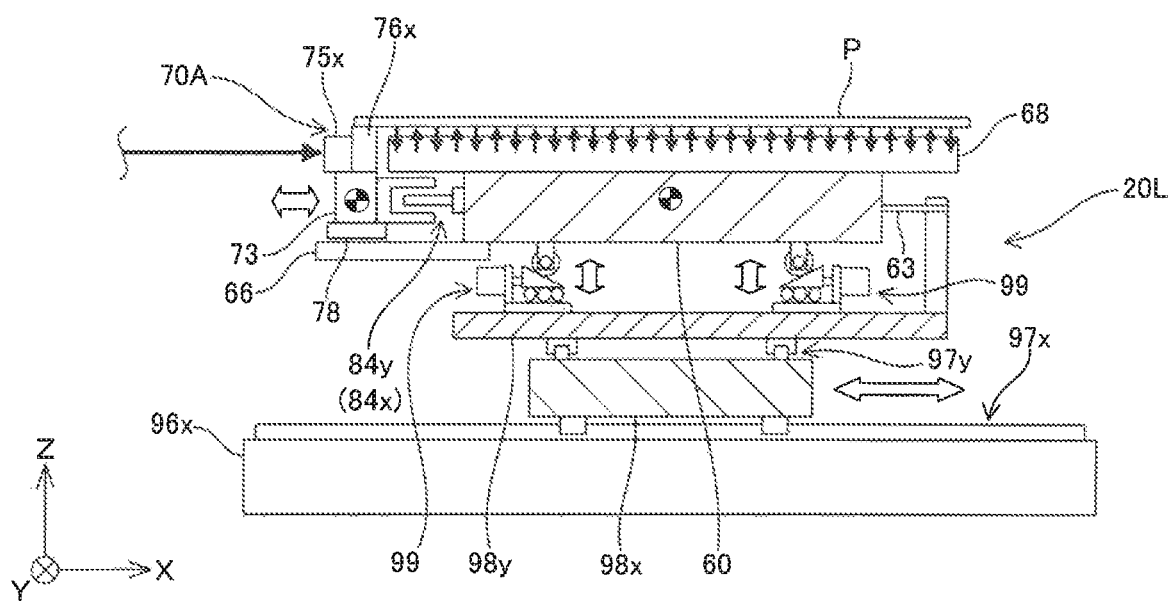
FIG. 16 is a view showing a substrate stage device related to a modified example (No. 12) of the first embodiment.

FIG. 16 shows a substrate stage device 20L related to a twelfth modified example of the first embodiment described above. Substrate stage device 20L includes a gantry type two-dimensional stage device that is equipped with an X coarse movement stage 98x that is driven linearly in the X-axis direction on an X guide 96x via an X drive system 97x, and a Y coarse movement stage 98y that is driven linearly in the Y-axis direction on X coarse movement stage 98x via a Y drive system 97y, and substrate table 60 is placed on Y coarse movement stage 98y via a plurality of Z actuators 99. Note that, although a cam device is used as Z actuator 99 in FIG. 16, the configuration of the Z actuator is not particularly limited. For example, four in total of z actuators 99 are provided corresponding to the four corners of substrate table 60, and substrate table 60 is finely driven with respect to Y coarse movement stage 98 in the Z-axis direction, the θx direction and the θy direction as needed by, for example, the four Z actuators 99. Since the configuration of substrate carrier 70A is the same as that in the first modified example described above (see FIG. 5), the description thereof will be omitted.

Second Embodiment

Next, a liquid crystal exposure apparatus related to a second embodiment will be described, using FIGS. 17A and 17B. The configuration of the liquid crystal exposure apparatus related to the second embodiment is the same as that in the first embodiment described above except for the configuration of substrate stage device 100 being different, and therefore only the different points will be described below.

Figure 17A:
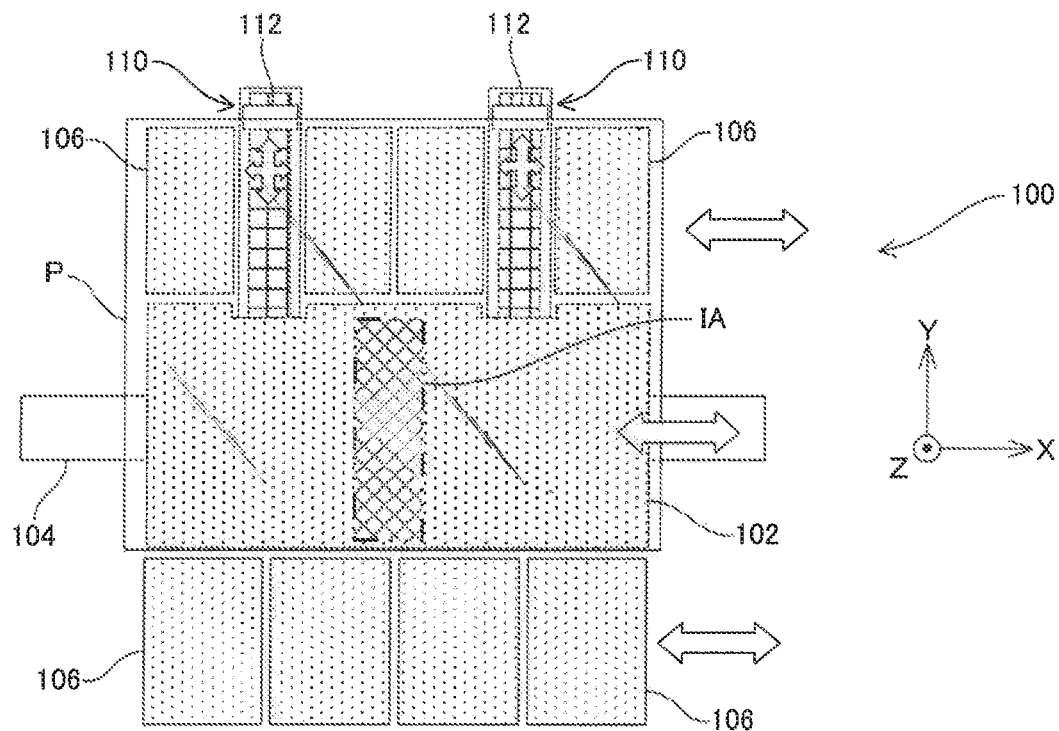
FIG. 17A is a plan view of a substrate stage device related to a second embodiment.
Figure 17B:
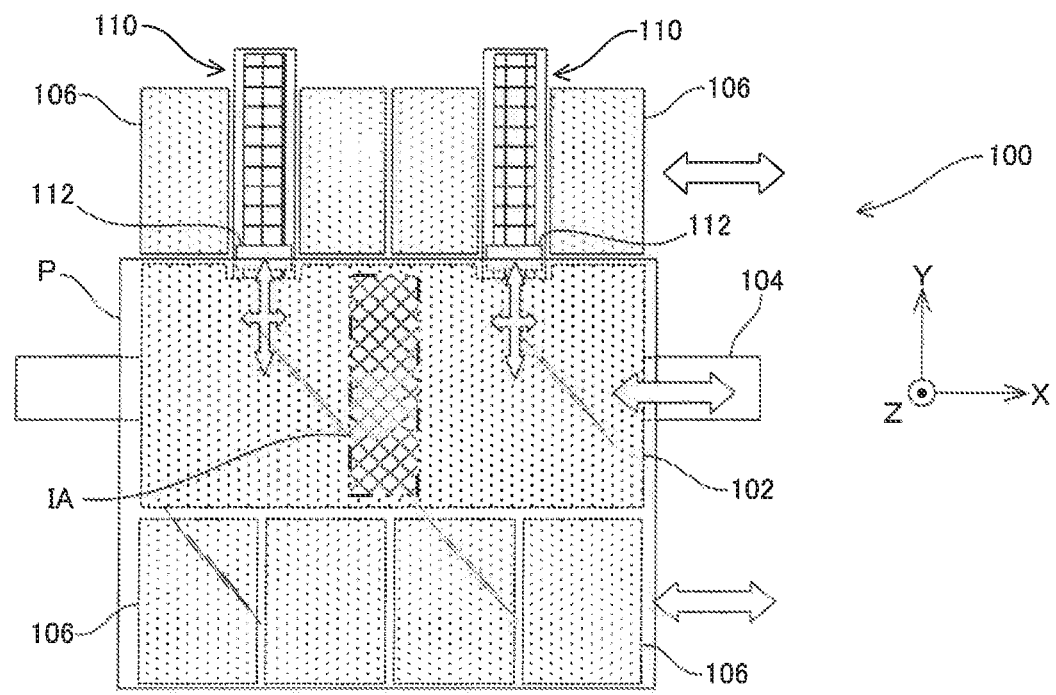
FIG. 17B is a view showing a state after a substrate is Y-stepped from a state shown in FIG. 17A.

As illustrated in FIG. 2, substrate holder 68 of the first embodiment described above has the substrate support surface having almost the same area as substrate P, whereas as illustrated in FIG. 17A, the size in the Y-axis direction (a cross-scan direction) of the substrate support surface of a substrate holder 102 that substrate stage device 100 of the present second embodiment has is set to around a size slightly longer than the size of exposure area IA in the Y-axis direction (around a size slightly longer than a half of the width (Y-axis) direction size of substrate P). Note that, similarly to the first embodiment described above, the size in the X-axis direction of the substrate support surface of substrate holder 102 is set to around the same as the size in the X-axis direction of substrate P. Substrate holder 102 is disposed below projection optical system 16 (not illustrated in FIGS. 17A and 17B, see FIG. 1), and causes the preload to act on a zone that is around a half of the entire area of substrate P that includes an area to exposed, and controls the flatness degree in the zone of substrate P. Substrate holder 102 is capable of finely driving substrate P in the Z-tilt directions in a state of holding substrate P using a Z actuator (not illustrated).

A plurality of air guide devices 106, for noncontactly supporting an area of substrate P that is not supported by substrate holder 102, are disposed in each of an area on the +Y side and an area of the −Y side of substrate holder 102. The Z-position of the upper surface of each of the plurality of air guide devise 106 is set to almost the same as the Z-position of the upper surface of substrate holder 102. While air guide device 106 is a device that noncontactly supports substrate P by blowing out the pressurized gas to the lower surface of substrate P, air guide device 106 needs not be capable of controlling the flatness degree of substrate P like substrate holder 102.

A pair of XY actuators 110 are disposed on an area on the +Y side of substrate holder 102, spaced apart in the X-axis direction. XY actuators 110 drive substrate carriers 112 that adsorb and hold the margin area set in the end vicinity part on the +Y side of substrate P, with a predetermined stroke (of around a half of the Y-axis direction size of substrate P) in the Y-axis direction and also finely drive substrate carriers 112 in the X-axis direction. The configuration of XY actuator 110 is not particularly limited, and a planar motor can be used. In substrate stage device 100, the θz position of substrate P can be controlled by making the respective Y positions of the pair of substrate carriers 112 different.

Each of substrate holder 102, the plurality of air guide devices 106 and the pair of XY actuators 110 described above is driven with a predetermined stroke in the X-axis direction along X guide 104 disposed below substrate holder 102. Here, substrate holder 102, the plurality of air guide devices 106 and the pair of XY actuators 110 may be integrally placed on a table member (not illustrated), and the table member may be drive in the X-axis direction, or each of substrate holder 102, the plurality of air guide devices 106 and the pair of XY actuators 110 may be individually driven in the X-axis direction.

In substrate stage device 100, for example, on an exposure operation of a step-and-scan method, in the case of transferring a mask pattern onto an area on the −Y side of substrate P, as illustrated in FIG. 17A, the pair of substrate carriers 112 are positioned at a stroke end on the +Y side. With this positioning, a half area on the −Y side of substrate P is noncontactly held by substrate holder 102 and a half area on the +Y side of substrate P is noncontactly supported by the plurality of air guide devices 106, and in this state, each of substrate holder 102, the plurality of air guide devices 106 and the pair of XY actuators 110 is driven with respect to exposure area IA with a predetermined stroke in the X-axis direction. Further, in the case of transferring a mask pattern on an area on the +Y side of substrate P, as illustrated in FIG. 17B, the pair of substrate carriers 112 are positioned at a stroke end on the −Y side. With this positioning, a half area on the +Y side of substrate P is noncontactly held by substrate holder 102 and a half area on the −Y side of substrate P is noncontactly supported by the plurality of air guide devices 106, and in this state, an alignment operation is performed, and then each of substrate holder 102, the plurality of air guide devices 106 and the pair of XY actuators 110 is driven with respect to exposure area IA with a predetermined stroke in the X-axis direction. On this operation, the flatness degree control (air adjustment control) of substrate P may be performed again. Positional information of the pair of substrate carriers 112 (or substrate P) should be obtained using, for example, a laser interferometer system or an encoder system.

According to substrate stage device 100 related to the present second embodiment, similarly to the first embodiment described above, the pair of substrate carriers 112, which hold the margin area of substrate P and finely drive substrate P with respect to substrate holder 102 in the directions of three degrees of freedom within the horizontal plane, and substrate holder 102 are disposed noncontactly with each other, and have structures that are mechanically separated from each other, and therefore the pair of substrate carriers 112, and thus substrate P can be finely driven without driving substrate holder 102, and substrate p can be positioned with high accuracy. In this manner, in substrate stage device 100, it is not necessary to drive substrate holder 102 when finely driving substrate P, and an object to be driven on the fine driving is light in weight, and therefore substrate P can be finely driven with high speed and the positioning accuracy of substrate P can be improved, compared to the conventional art. Further, in the present second embodiment, substrate holder 102 is smaller in size and lighter in weight, compared to that in the first embodiment described above, which allows for the low cost. Further, since substrate holder 102 needs not be moved in the Y-axis direction, the configuration of substrate stage device 100 becomes simple. Further, since substrate holder 102 and substrate P are constantly in noncontact, a position changing operation of substrate P with respect to exposure area IA can be performed swiftly. Further, since substrate holder 102 does not adsorb and hold (does not come into contact with) substrate P, there is no risk of generating dust even if the position changing operation with respect to exposure area IA is frequently performed, which allows substrate holder 102 to be maintenance-free.

Note that, although the case has been described where air guide devices 106 disposed on the −Y side of substrate holder 102 are moved together with substrate P (substrate holder 102) in the X-axis direction, this is not intended to be limiting, and for example, when substrate P is moved in the X-axis direction, air guide device 106 with a length that can suppress the bending of substrate P (that covers a movement range of substrate P) may be disposed on the −Y side of substrate holder 102. Further, the pair of XY actuators 110 are configured movable in the X-axis direction relative to air guide devices 106, and also air guide devices 106 disposed on the +Y side of substrate holder 102 are disposed capable of covering the movement range of substrate P in the X-axis direction, and thereby air guide devices 106 on the +Y side may be configured to be disposed fixedly without being moved in the X-axis direction. Further, the size of substrate holder 102 in the X-axis direction is made to be a size enough to cover the movement range of substrate P, thereby substrate holder 102 may be configured to be disposed fixedly without being moved in the X-axis direction. In this case, further, air guide devices 106 are disposed fixedly in the X-axis direction, and thereby the pair of XY actuators 110 may be configured to be moved in the X-axis direction. Further, the size of substrate holder 102 is not limited to about a half of substrate P, and can be changed as need in accordance with the size of exposure area IA.

Figure 18A:
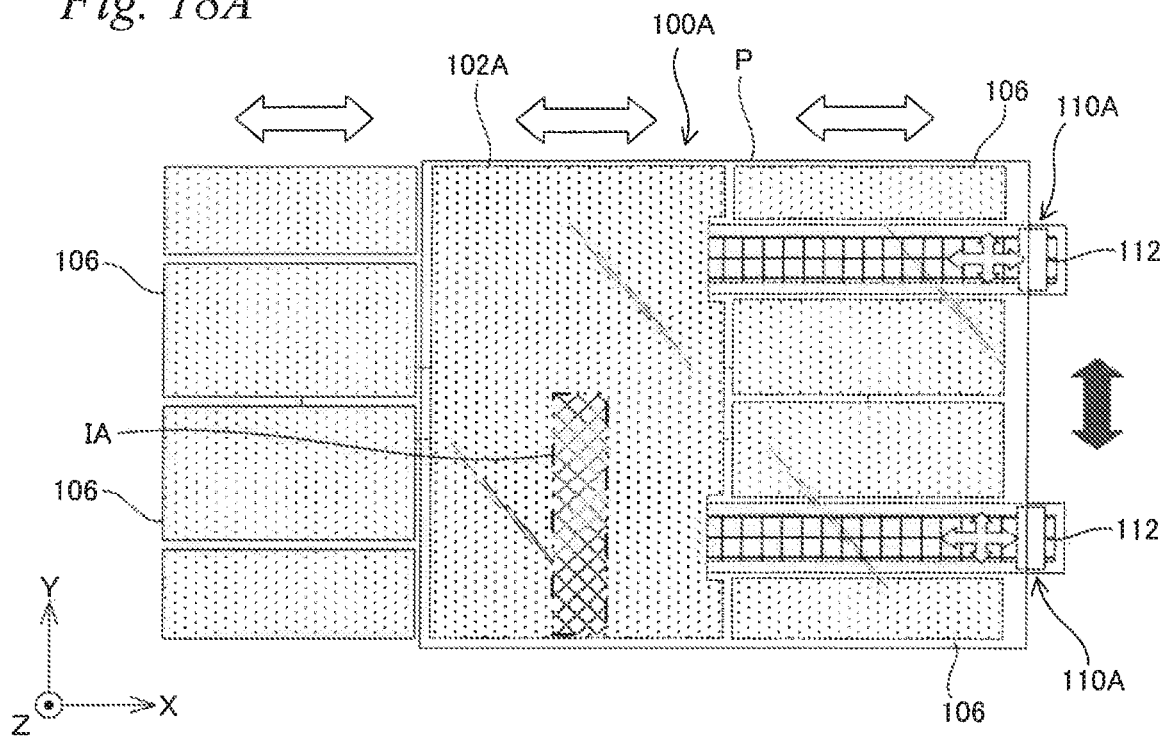
FIG. 18A is a plan view of a substrate stage device related to a modified example of the second embodiment.
Figure 18B:
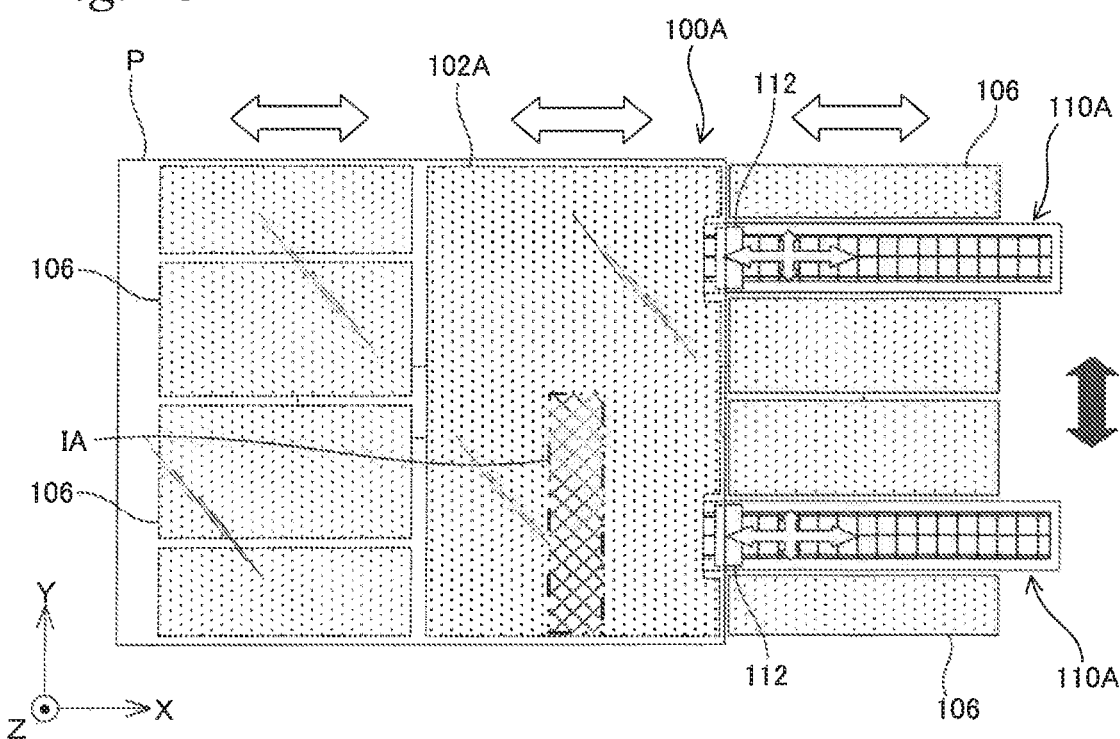
FIG. 18B is a view showing a state after a substrate is Y-stepped from a state shown in FIG. 18A.

Note that the configuration of substrate stage device 100 related to the present second embodiment can be changed as needed. As an example, FIGS. 18A and 18B show a substrate stage device 100A related to a modified example of the second embodiment. Note that, in substrate stage device 100A, elements that have the same configurations and functions as those in the second embodiment described above will be provided with the same reference signs as those of substrate stage device 100 (see FIGS. 17A and 17B) in the second embodiment described above, and the description thereof will be omitted.

The X-axis direction size of a substrate holder 102A that substrate stage device 100A has is set to around a half of the X-axis direction size of substrate P, and the Y-axis direction size of substrate holder 102A is set to around the same as the Y-axis direction size of substrate P. Further, a plurality of air guide devices 106 are disposed on the +X side and the −X side of substrate holder 102A, a pair of XY actuators 110A are disposed corresponding to a pair of substrate carriers 112 on the +X side of substrate holder 102A. In substrate stage device 100A, for a Y step operation (an inter-shot-area movement operation), substrate holder 102A, the plurality of air guide devices 106 and the pair of XY actuators 110A are integrally driven in the Y-axis direction (see black arrows in FIGS. 18A and 18B). Further, by moving the pair of substrate carriers 112 that hold substrate P in the X-axis direction, an X step operation (an inter-shot-area movement operation) of substrate P is performed. Note that, on an exposure operation, similarly to the second embodiment described above, substrate holder 102A, the plurality of air guide devices 106 and the pair of XY actuators 110A are integrally driven with respect to exposure area IA in the X-axis direction. In substrate stage device 100A, a movement distance of substrate holder 102A in the X-axis direction can be shortened. Note that, similarly to the second embodiment described above, the size of substrate holder 102A can be changed as needed in accordance with the size of exposure area IA.

Third Embodiment

Figure 19:
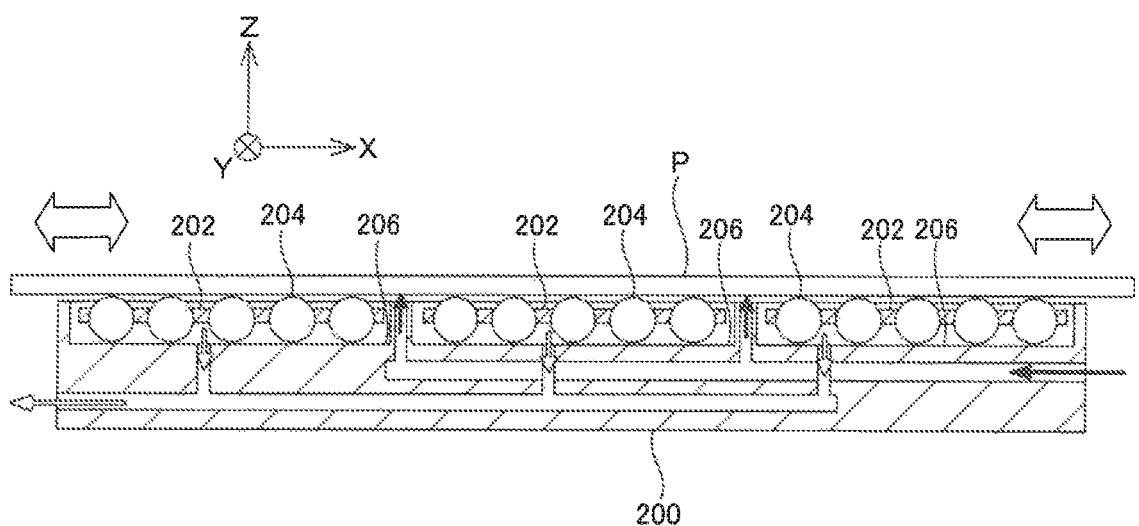
FIG. 19 is a cross-sectional view of a substrate holder related to a third embodiment.

Next, a liquid crystal exposure apparatus related to a third embodiment will be described using FIG. 19. The configuration of the liquid crystal exposure apparatus related to the third embodiment is the same as that in the first embodiment described above except for the configuration of a substrate holder 200 being different, and therefore only the different points will be described below.

In the first embodiment described above, substrate holder 68 (see FIG. 4) has a configuration of noncontactly holding substrate P via the gas film, whereas substrate holder 200 related to the present third embodiment supports substrate P in a contact state and yet in a low friction state, using a plurality of balls 204 disposed at a predetermined spacing via a retainer 202. The plurality of balls 204 are accommodated in a plurality of grooves 206 formed in the upper surface of substrate holder 200. Hole sections to blow out the pressurized gas to the lower surface of substrate P (see black arrows in FIG. 19) are open to an area, of the upper surface of substrate holder 200, where grooves 206 are not formed (that face the lower surface of substrate P), and hole sections for vacuum suction to causes the preload (see white arrows in FIG. 19) to act on substrate P are open to the bottom surfaces of grooves 206. Note that, although not illustrated in FIG. 19, substrate P is held by substrate carrier 70 (see FIG. 3C) having a configuration similar to that in the first embodiment described above, and is finely driven with respect to substrate holder 200 in the directions of three degrees of freedom within the horizontal plane. Note that a support mechanism that supports substrate P in a contact state is not limited to a configuration using ball-like members such as the plurality of balls 204, but only has to be a configuration capable of supporting substrate P in a low friction state. More generally, the support mechanism that supports substrate P in a contact state only has to be a configuration that can support substrate P finely drivable relative to a substrate holder in at least one direction of the X-axis direction, the Y-axis direction and the θz direction, and is preferably a configuration that can support substrate P finely drivable substantially independently of the substrate holder.

Fourth Embodiment

Next, a liquid crystal exposure apparatus related to a fourth embodiment will be described using FIGS. 20 to 21B. The configuration of the liquid crystal exposure apparatus related to the fourth embodiment is the same as that in the first embodiment described above except for the configuration of a substrate stage device 320 being different, and therefore elements that have the same configurations and functions as those of substrate stage device 20 (see FIGS. 1 to 4) in the first embodiment described above will be provided with the same reference signs as those in the first embodiment described above and the description thereof will be omitted, and only the different points will be described below.

Figure 21A:
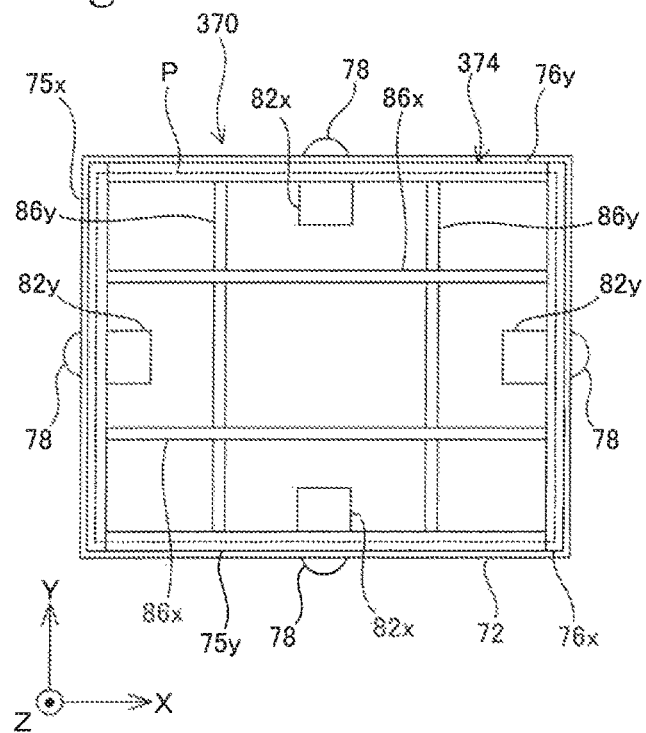
FIG. 21A is a plan view of a substrate carrier related to the fourth embodiment.

Since substrate carrier 70 (see FIG. 3C) of the first embodiment described above has a configuration of adsorbing and holding only the outer peripheral part of substrate P from below, carrier main body 74 (see FIG. 3C) is formed into a frame-like rectangular shape in planar view, whereas a carrier main body 374 of a substrate carrier 370 related to the present fourth embodiment is further equipped with a pair of X coupling bars 86x bridging between X bar mirror 75X and X support section 76X and a pair of Y coupling bars 86y bridging between Y bar mirror 75y and Y support section 76y, as illustrated in FIG. 21A. Note that the pair of X coupling bars 86x and the pair of Y coupling bars 86y are members provided to improve the overall rigidity (such as the bending rigidity and the torsional rigidity) of substrate carrier 370, and do not support substrate P from below. That is, the Z-position of the upper surface of each of the pair of X coupling bars 86x and the pair of Y coupling bars 86y is set lower than the Z-position of the upper surface of each of X bar mirror 75x, X support section 76x, Y bar mirror 75y and Y support section 76y, and in a state where the margin areas of substrate P are adsorbed and held by carrier main body 374, a predetermined clearance is formed between the lower surface of substrate P and the upper surface of each of X coupling bars 86x and Y coupling bars 86y, irrespective of the bending of substrate P.

Figure 20:
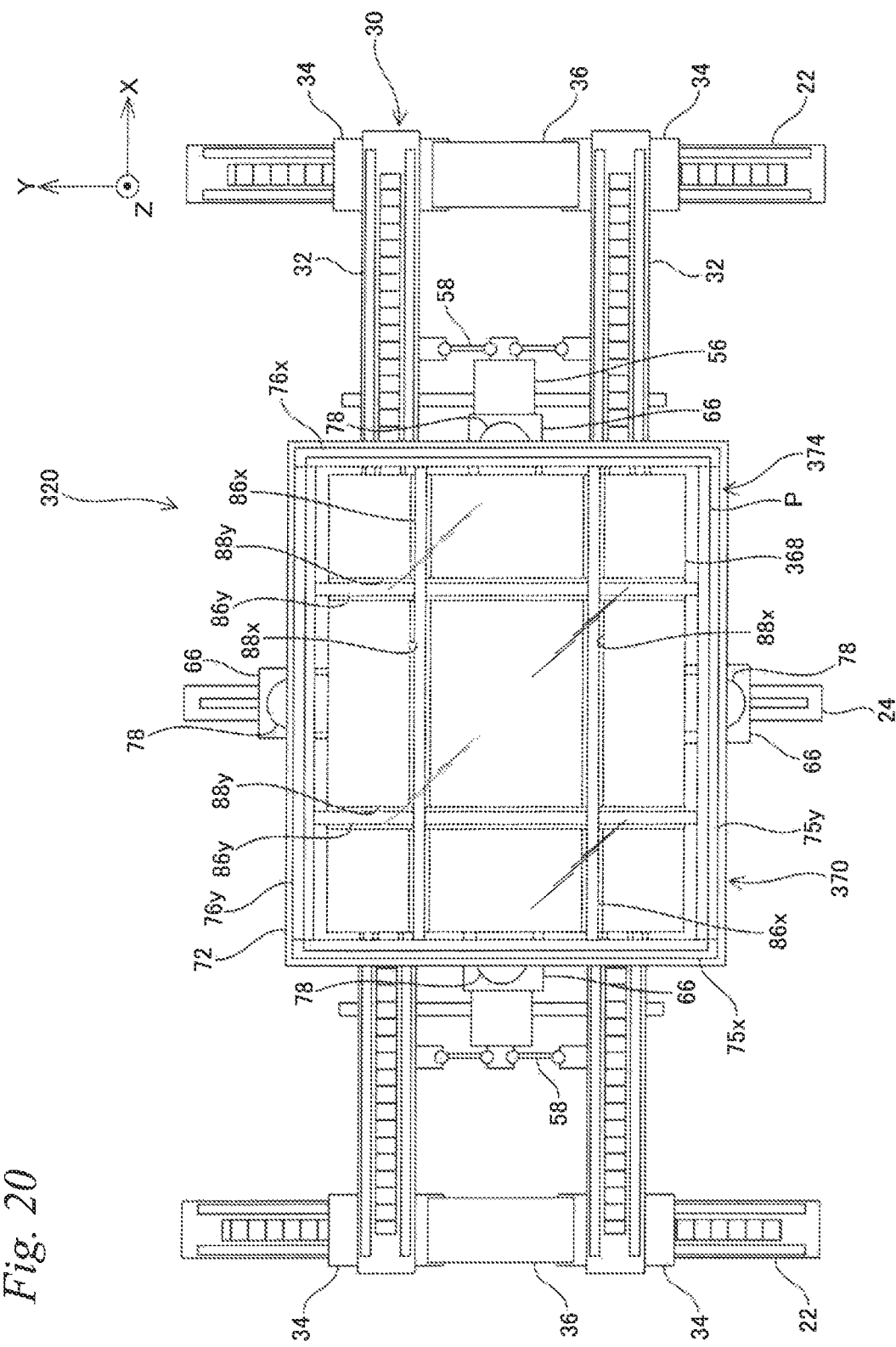
FIG. 20 is a plan view of a substrate stage device related to a fourth embodiment.
Figure 21B:
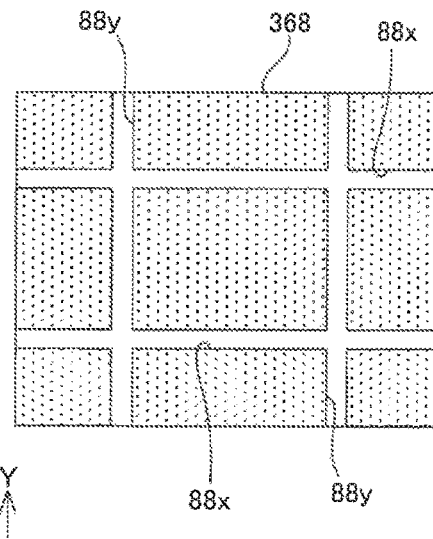
FIG. 21B is a plan view of a substrate holder related to the fourth embodiment.

In the present fourth embodiment, as illustrated in FIG. 20, substrate P is noncontactly supported from below by a substrate holder 368, which is similar to the first embodiment described above (see FIGS. 1 to 4). On substrate holder 368, X grooves 88x and Y grooves 88y for accommodating the pair of X coupling members 86x and the pair of Y coupling members 86Y, respectively, are formed. As illustrated in FIG. 21B, X grooves 88x and Y grooves 88y are open to the upper surface of substrate holder 368. Between wall surfaces that define X grooves 88x and Y grooves 88y, and X coupling bars 86x and Y coupling bars 86y, such a clearance is formed that prevents the wall surfaces and the coupling bars from coming into contact with each other even when substrate carrier 370 is finely driven with respect to substrate holder 368.

According to substrate stage device 320 related to the present fourth embodiment, since the rigidity of substrate carrier 370 is improved, the positioning accuracy of substrate P is improved. Further, sine the orthogonality between the respective reflection surfaces of X bar mirror 75x and Y bar mirror 75y that substrate carrier 370 has can be maintained properly, the position controllability of substrate P is improved.

Figure 22A:
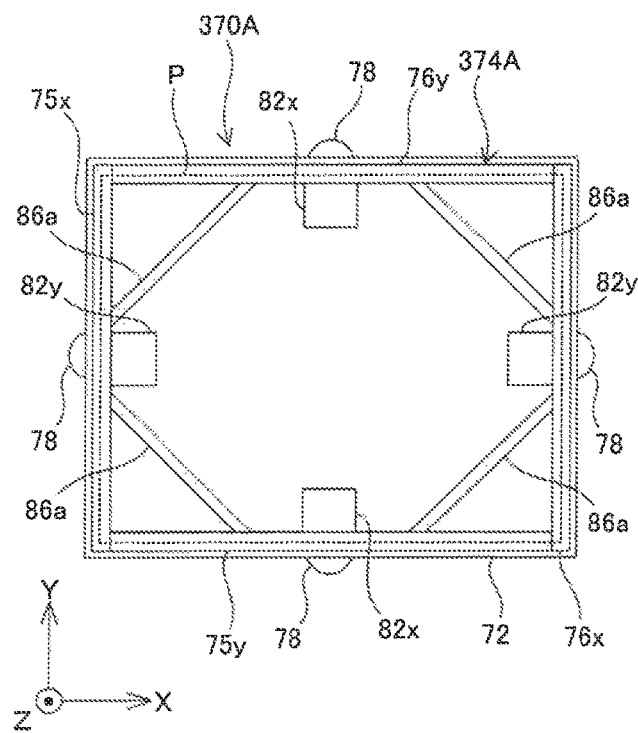
FIG. 22A is a plan view of a substrate carrier related to a modified example of the fourth embodiment.
Figure 22B:
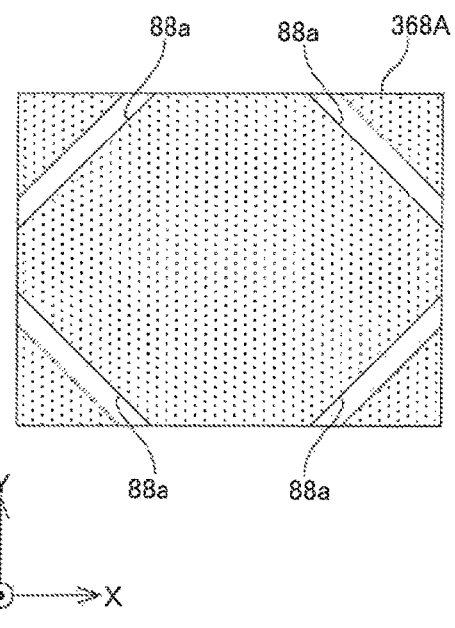
FIG. 22B is a plan view of a substrate holder related to a modified example of the fourth embodiment.

Note that the disposition, the number and the shape of stiffening members for improving the rigidity of substrate carrier 370 can be changed as needed. As an example, like a substrate carrier 370A related to a modified example of the fourth embodiment as illustrated in FIG. 22A, a so-called knee brace 86a may be bridged, severally, between X bar mirror 75x and Y support section 76y, between X bar mirror 75x and Y bar mirror 75y, between Y bar mirror 75y and X support section 76x, and between X support section 76x and Y support section 76y. In this case, as illustrated in FIG. 22B, a plurality of grooves 88a are formed at a substrate holder 368A, in accordance with the positions of a plurality of knee braces 86a descried above that are provided at substrate carrier 370A.

Fifth Embodiment

Figure 23:
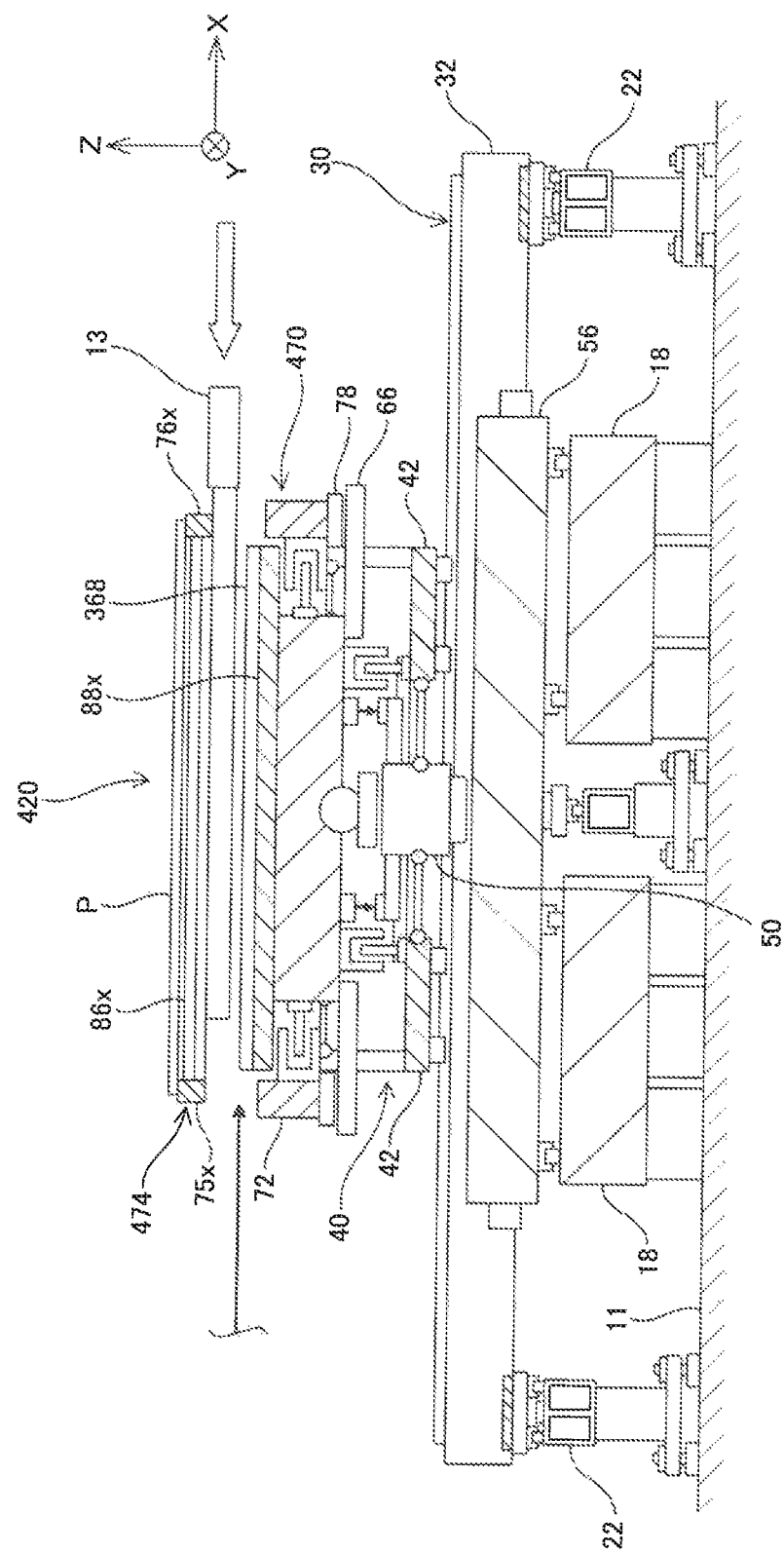
FIG. 23 is a view showing a substrate stage device related to a fifth embodiment.

Next, a liquid crystal exposure apparatus related to a fifth embodiment will be described using FIG. 23. The configuration of the liquid crystal exposure apparatus related to the fifth embodiment is the same as that in the fourth embodiment described above except for the configuration of a substrate carrier 470 being different, and therefore elements that have the same configurations and functions as those of substrate stage device 320 (see FIG. 21) in the fourth embodiment described above will be provided with the same reference signs as those in the fourth embodiment described above and the description thereof will be omitted, and only the different points will be described.

In the present fifth embodiment, in substrate carrier 470, a carrier main body 474 is attachable and detachable to/from base 72. In carrier main body 474, similarly to the fourth embodiment described above, X coupling bars 86x are bridged between X bar minor 75x and X support section 76x, and although not illustrated, Y coupling bars 86y (see FIG. 21A) are also bridged between Y bar minor 75y and Y support section 76y. Further, X grooves 88x and Y grooves 88y (not illustrated in FIG. 23, see FIG. 21B) for accommodating X coupling bars 86x and Y coupling bars 86y described above are formed at substrate holder 368. As is described above, since X grooves 88x and Y grooves 88y are open to the upper surface of substrate holder 368, substrate P can be easily separated from substrate stage device 420 by moving carrier main body 474 separately from base 72 to the +Z side (lifting up carrier main body 474).

Then, in the present fifth embodiment, the carry-in and the carry-out of substrate P to/from substrate stage device 420 are performed by moving carrier main body 474 on which substrate P is placed with respect to substrate holder 368. The configuration of a device for moving carrier main body 474 is not particularly limited, and for example, a multi-joint robot known to public can be used. Carrier main body 474 has the end on the +Y side and the end on the −Y side (or a part of the respective ends) overhanging outward from base 72, and the overhanging parts are supported from below by a conveyance arm 13 that the robot described above for conveyance has. A vacuum suction device (not illustrated) is connected to conveyance arm 13 so that substrate P is adsorbed and held by carrier main body 474 in a state where carrier main body 474 is supported by conveyance arm 13. On the conveyance of substrate P, substrate P is supported from below by X coupling bars 86x and Y coupling bars 86y (see FIG. 21A) that carrier main body 474 has. With this operation, the bending caused by the self-weight is suppressed. Further, although not illustrated, a plurality of carrier main bodies 474 are prepared, a carry-in operation and a carry-out operation of substrate P are performed while exchanging the plurality of carrier main bodies 474. Consequently, the efficiency of a substrate exchange operation is high.

Note that the configurations of the first to the fifth embodiments described above (including the modified examples thereof, and the same applies to the following descriptions) can be changed as needed. For example, in the first embodiment described above, substrate carrier 70 may be finely drivable with respect to substrate table 60 (and substrate holder 68) in the Z-tilt directions. Further, substrate table 60 and substrate holder 68 (see FIG. 4 for each of them) are configured as different members, but may be configured of a single member.

Further, along with blowing out the pressurized gas to guide plates 66 from air bearings 78 attached to substrate carrier 70, vacuum suction or magnetic attraction may be performed, and thereby the high rigidity of the gas films formed by air bearings 78 may be achieved. Further, the positional relationship between air bearings 78 and guide plates 66 may be reversed. That is, guide plates 66 are fixed to the substrate carrier 70 side and air bearings 78 are attached to the substrate table 60 side. In this case, since the piping for pressurized gas supply needs not be connected to substrate carrier 70, the load variation due to resistance of the piping or the transmission of disturbance is suppressed, which is preferable from the viewpoint of position control of substrate carrier 70.

Further, the illumination light may be ultraviolet light such as an ArF excimer laser beam (with a wavelength of 193 nm) or a KrF excimer laser beam (with a wavelength of 248 nm), or vacuum ultraviolet light such as an $F_2$ laser beam (with a wavelength of 157 nm). Further, as the illumination light, a harmonic wave, which is obtained by amplifying a single-wavelength laser beam in the infrared or visible range emitted by a DFB semiconductor laser or a fiber laser, with a fiber amplifier doped with, for example, erbium (or both erbium and ytterbium), and by converting the wavelength into ultraviolet light using a nonlinear optical crystal, may also be used. Further, a solid laser (with a wavelength: 355 nm and 266 nm) or the like may be used.

Further, although the case has been described where projection optical system 16 is a projection optical system of a multi-lens method equipped with a plurality of optical systems, the number of the projection optical system is not limited thereto, and one or more of the projection optical systems have only to be provided. Further, the projection optical system is not limited to the projection optical system of a multi-lens method, but may be a projection optical system using an Offner type large mirror or the like. Further, projection optical system 16 may be a magnifying system or a reduction system.

Further, the use of the exposure apparatus is not limited to the exposure apparatus used for liquid crystal display devices that transfers a liquid crystal display device pattern onto a square-shaped glass plate, but can be widely applied also to, for example, an exposure apparatus for manufacturing organic EL (Electro-Luminescence) panels, an exposure apparatus for manufacturing semiconductor devices, and an exposure apparatus for manufacturing thin-film magnetic heads, micromachines, DNA chips or the like. Further, each of the embodiments described above can also be applied to an exposure apparatus that transfers a circuit pattern onto a glass substrate or a silicon wafer or the like, not only when producing microdevices such as semiconductor devices, but also when producing a mask or a reticle used in an exposure apparatus such as an optical exposure apparatus, an EUV exposure apparatus, an X-ray exposure apparatus, or an electron beam exposure apparatus.

Further, an object serving as an exposure target is not limited to a glass plate, but may be other objects such as a wafer, a ceramic substrate, a film member, or a mask blank. Further in the case where the exposure target is a substrate for flat-panel display, the thickness of the substrate is not particularly limited, and for example, a film-like member (a sheet-like member that is flexible) is also included. Note that the exposure apparatus of the present embodiments is especially effective in the case where a substrate having a side or a diagonal line with a length of 500 mm or greater is the exposure target.

Electronic devices such as liquid crystal display devices (or semiconductor devices) are manufactured through the steps such as: a step in which the function/performance design of a device is performed; a step in which a mask (or a reticle) based on the design step is manufactured; a step in which a glass substrate (or a wafer) is manufactured; a lithography step in which a pattern of the mask (the reticle) is transferred onto the glass substrate with the exposure apparatus in each of the embodiments described above and the exposure method thereof; a development step in which the glass substrate that has been exposed is developed; an etching step in which an exposed member of the other section than a section where resist remains is removed by etching; a resist removal step in which the resist that is no longer necessary when etching is completed is removed; a device assembly step; and an inspection step. In this case, in the lithography step, the exposure method described previously is implemented using the exposure apparatus in each of the embodiments described above and a device pattern is formed on the glass substrate, and therefore, the devices with a high integration degree can be manufactured with high productivity.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. An exposure apparatus that scans and exposes each of a plurality of areas on an object by irradiating the object with an illumination light via an optical system and relatively moving the object with respect to the illumination light in a scanning direction, the apparatus comprising:
   a support section that levitates and supports at least a first area and a second area of the plurality of areas of the object, the second area being different from the first area in position in a non-scanning direction intersecting the scanning direction;
   a holding section that holds the object levitated and supported by the support section;

a first drive system that moves the support section;
a second drive system that moves the holding section; and
a control system that controls the first drive system to move the support section facing the first and the second areas of the object in the scanning direction and controls the second drive system to move the holding section in the scanning direction, in scanning exposure with respect to the first area supported by the support section, wherein
the control system changes an area to which the scanning exposure is performed from the first area to the second area by controlling the first drive system to move the support section supporting the first area and the second area in the non-scanning direction, and by controlling the second drive system to move the holding section in the non-scanning direction.

2. The exposure apparatus according to claim 1, wherein in the scanning exposure, the control system controls the first and the second drive systems to adjust a position of the object with respect to the illumination light by relatively moving the holding section with respect to the support section.

3. The exposure apparatus according to claim 1, wherein the holding section can be relatively moved with respect to the support section in the scanning direction and the non-scanning direction.

4. The exposure apparatus according to claim 1, wherein the support section levitates and supports the holding section.

5. The exposure apparatus according to claim 1, wherein the control system adjusts a position of the object on the basis of positions of the first area and the second area with respect to the illumination light.

6. The exposure apparatus according to claim 1, wherein the first drive system relatively moves the support section with respect to the holding section in a third direction parallel to an optical axis direction of the optical system.

7. The exposure apparatus according to claim 1, further comprising:
an acquisition section that acquires information on a position of the holding section, wherein
a part of the acquisition section is provided at the holding section.

8. The exposure apparatus according to claim 7, wherein the acquisition section includes an optical interferometer system, and
a reflection surface for position measurement using the optical interferometer system is formed at the holding section.

9. The exposure apparatus according to claim 1, wherein the support section has a gas supplying hole that supplies a gas to between the object and the support section.

10. The exposure apparatus according to claim 9, wherein the support section has a gas suctioning hole that suctions a gas between the object and the support section.

11. The exposure apparatus according to claim 1, wherein the first drive system comprises a guidance device that is provided movable in a direction parallel to a predetermined plane orthogonal to an optical axis of the optical system, and guides the support section into the scanning direction in which the object is moved when the scanning exposure is performed, and
the holding section is placed on the guidance device.

12. The exposure apparatus according to claim 1, wherein the support section is provided on a guide member that has a guide surface parallel to a predetermined plane orthogonal to an optical axis of the optical system, and the holding section is placed on the guide surface.

13. The exposure apparatus according to claim 1, wherein elements configuring the first drive system and elements configuring the second drive system are at least partially in common.

14. The exposure apparatus according to claim 1, further comprising:
a pattern forming device that forms a predetermined pattern on the object using an energy beam.

15. The exposure apparatus according to claim 14, wherein
the object is a substrate used for a flat-panel display.

16. The exposure apparatus according to claim 15, wherein
the substrate has at least a side or a diagonal line with a length of 500 mm or greater.

17. A manufacturing method of a flat-panel display, comprising:
exposing the object using the exposure apparatus according to claim 1; and
developing the object that has been exposed.

18. A device manufacturing method, comprising:
exposing the object using the exposure apparatus according to claim 1; and
developing the object that has been exposed.

19. An exposure method of scanning and exposing each of a plurality of areas on an object by irradiating the object with an illumination light via an optical system and relatively moving the object with respect to the illumination light in a scanning direction, the method comprising:
levitating and supporting at least a first area and a second area of the plurality of areas of the object, using a support section, the second area being different from the first area in position in a non-scanning direction intersecting the scanning direction;
holding the object levitated and supported by the support section, using a holding section;
controlling a first drive system that moves the support section facing the first and the second areas of the object and a second drive system that moves the holding section so that the support section and the holding section are each moved in the scanning direction, in scanning exposure with respect to the first area; and
changing an area to which the scanning exposure is performed from the first area to the second area, by controlling the first drive system to move the support section supporting the first area and the second area in the non-scanning direction, and by controlling the second drive system to move the holding section in the non-scanning direction.

20. The exposure method according to claim 19, wherein in the controlling, the first and the second drive systems are controlled so that a position of the object with respect to the illumination light is adjusted by relatively moving the holding section with respect to the support section in the scanning exposure.

21. The exposure method according to claim 19, wherein the holding section can be relatively moved with respect to the support section in the scanning direction and the non-scanning direction.

22. The exposure method according to claim 19, wherein in the controlling, a position of the object is adjusted on the basis of positions of the first area and the second area with respect to the illumination light.

23. The exposure method according to claim 19, wherein the first drive system relatively moves the support section with respect to the holding section in a third direction parallel to an optical axis direction of the optical system.

24. The exposure method according to claim 19, further comprising:
acquiring information on a position of the holding section, using an acquisition section, wherein
a part of the acquisition section is provided at the holding section.

25. The exposure method according to claim 24, wherein the acquisition section includes an optical interferometer system, and
a reflection surface for position measurement using the optical interferometer system is formed at the holding section.

26. The exposure method according to claim 19, wherein the support section has a gas supplying hole that supplies a gas to between the object and the support section.

27. The exposure method according to claim 26, wherein the support section has a gas suctioning hole that suctions a gas between the object and the support section.

28. The exposure method according to claim 19, wherein the holding section is placed on the support section.

29. The exposure method according to claim 19, wherein the first drive system comprises a guidance device that is provided movable in a direction parallel to a predetermined plane orthogonal to an optical axis of the optical system, and guides the support section into the scanning direction in which the object is moved when the scanning exposure is performed, and
the holding section is placed on the guidance device.

30. The exposure method according to claim 19, wherein the support section is provided on a guide member that has a guide surface parallel to a predetermined plane orthogonal to an optical axis of the optical system, and
the holding section is placed on the guide surface.

31. The exposure method according to claim 19, wherein elements configuring the first drive system and elements configuring the second drive system are at least partially in common.

32. The exposure method according to claim 19, further comprising:
forming a predetermined pattern on the object using an energy beam.

33. The exposure method according to claim 32, wherein the object is a substrate used for a flat-panel display.

34. The exposure method according to claim 33, wherein the substrate has at least a side or a diagonal line with a length of 500 mm or greater.

35. A manufacturing method of a flat-panel display, comprising:
exposing the object using the exposure method according to claim 19; and
developing the object that has been exposed.

36. A device manufacturing method, comprising:
exposing the object using the exposure method according to claim 19; and
developing the object that has been exposed.

* * * * *